United States Patent
Sasaoka et al.

(10) Patent No.: US 6,865,801 B2
(45) Date of Patent: Mar. 15, 2005

(54) APPARATUS FOR MANUFACTURING A WIRING BOARD

(75) Inventors: Kenji Sasaoka, Zama (JP); Fumitoshi Ikegaya, Ebina (JP); Takahiro Mori, Kawasaki (JP); Tomohisa Motomura, Inagi (JP); Yoshizumi Sato, Yokohama (JP); Koichiro Shibayama, Kuwana (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 528 days.

(21) Appl. No.: 09/897,998

(22) Filed: Jul. 5, 2001

(65) Prior Publication Data

US 2001/0039720 A1 Nov. 15, 2001

Related U.S. Application Data

(62) Division of application No. 09/093,605, filed on Jun. 9, 1998, now Pat. No. 6,507,995.

(30) Foreign Application Priority Data

Jun. 12, 1997 (JP) .......................................... P9-155462

(51) Int. Cl.$^7$ ................................................. H05K 3/10
(52) U.S. Cl. ............................. 29/745; 29/729; 29/738; 29/755
(58) Field of Search .......................... 29/883, 825, 846, 29/880, 852, 729, 745, 747, 738, 755

(56) References Cited

U.S. PATENT DOCUMENTS

| | | | | |
|---|---|---|---|---|
| 2,972,003 A | * | 2/1961 | Greenman et al. | 174/258 |
| 2,986,804 A | * | 6/1961 | Greenman et al. | 29/852 |
| 3,720,808 A | | 3/1973 | Morrissey | 219/469 |
| 4,079,509 A | | 3/1978 | Jackson et al. | 29/589 |
| 4,243,869 A | | 1/1981 | Scribner | 219/216 |
| 4,411,982 A | * | 10/1983 | Shibuya et al. | 430/314 |
| 4,584,767 A | * | 4/1986 | Gregory | 29/848 |
| 5,285,565 A | | 2/1994 | Ballard et al. | 29/609 |
| 5,421,080 A | | 6/1995 | Ballavance et al. | 29/825 |
| 5,600,103 A | | 2/1997 | Odaira et al. | 174/265 |
| 5,822,850 A | * | 10/1998 | Odaira et al. | 29/846 |
| 5,865,934 A | * | 2/1999 | Yamamoto et al. | 156/295 |

* cited by examiner

Primary Examiner—C. J. Arbes
(74) Attorney, Agent, or Firm—Finnegan, Henderson, Farabow, Garrett & Dunner, L.L.P.

(57) ABSTRACT

The apparatus for manufacturing a wiring substitute comprises a transporter having a circuit where a sheet is circulated; a screen printer for printing a conductive paste on the sheet; a counter for counting the number of times to print the conductive paste on the sheet; and a distributor for ejecting the sheet from the circuit when the counted number reaches a preset number. Thus, the conductive pillars having uniform properties can be formed automatically on the conductive foil with high productivity.

16 Claims, 17 Drawing Sheets

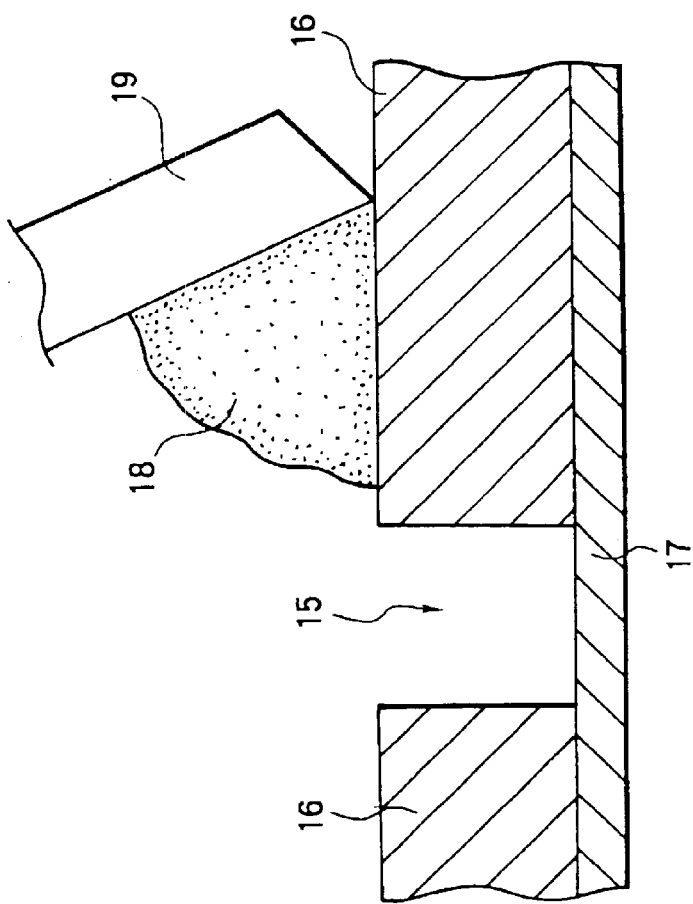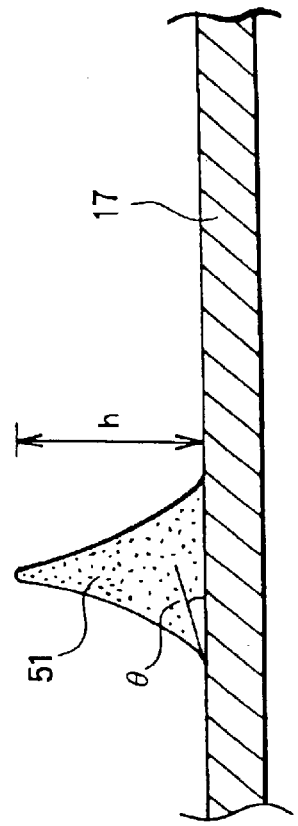
FIG. 4A
FIG. 4B

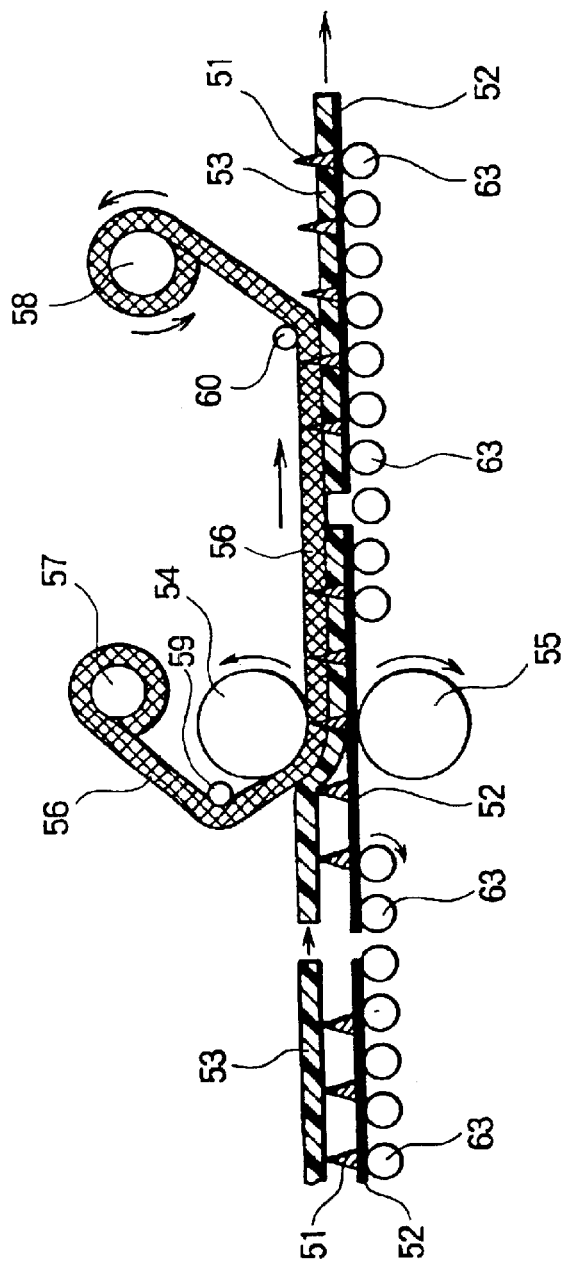
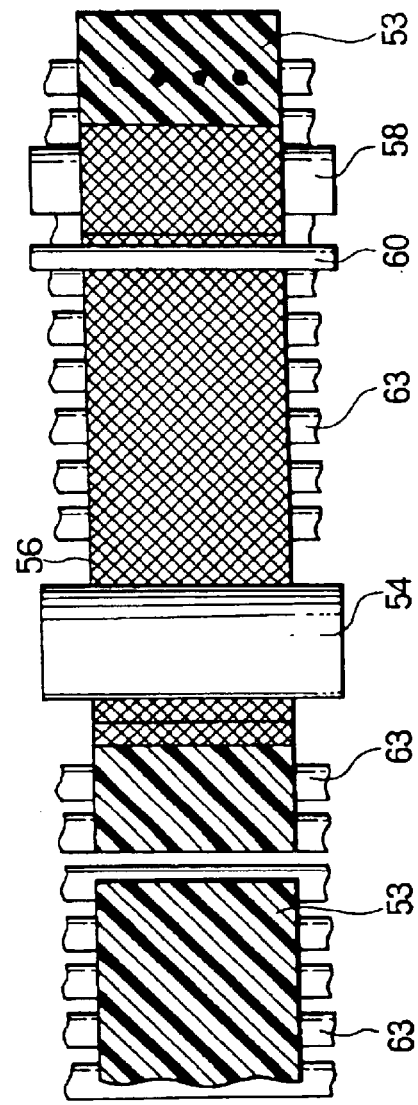
FIG. 10A
FIG. 10B

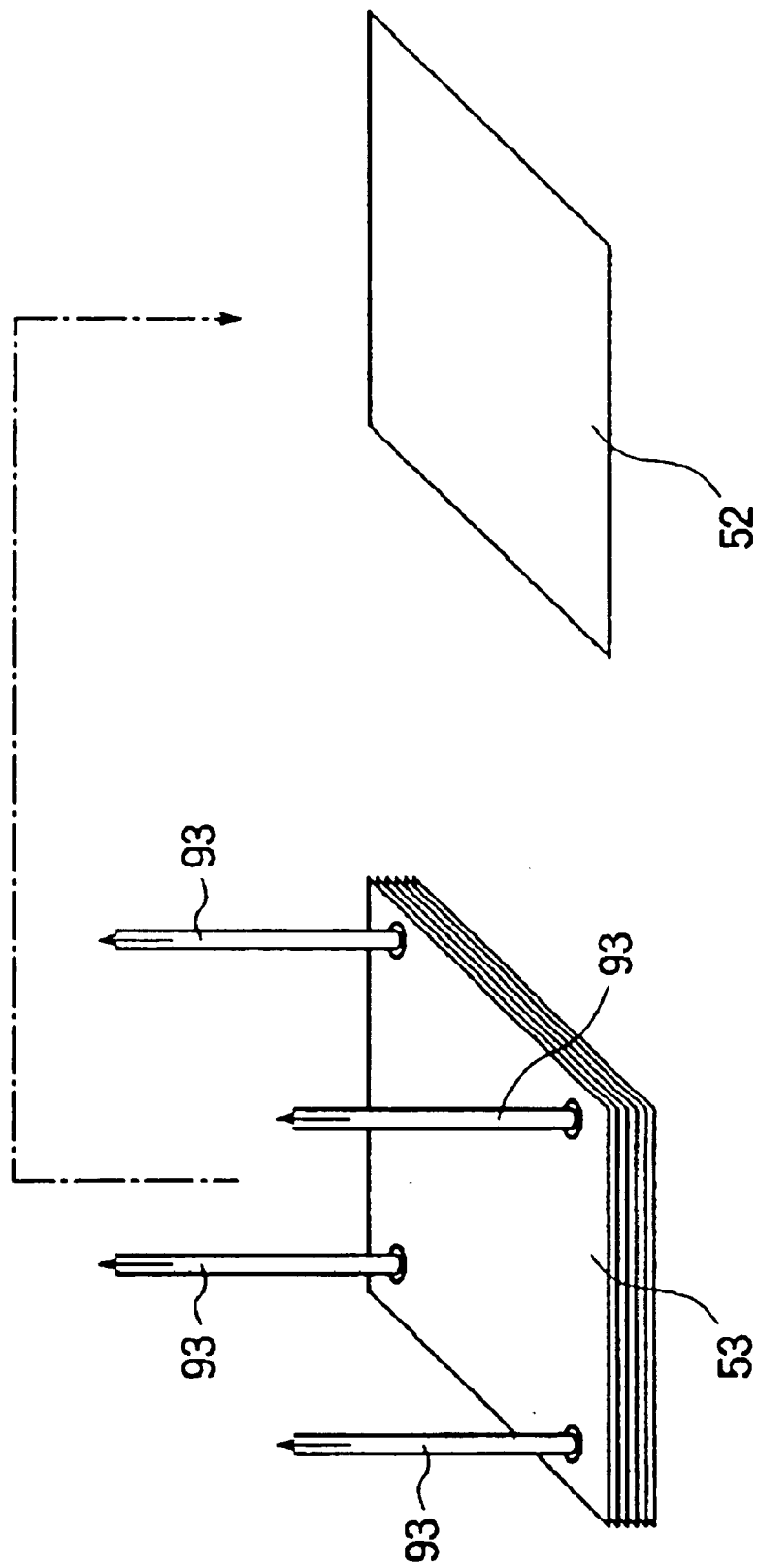

APPARATUS FOR MANUFACTURING A WIRING BOARD

This is a division of application Ser. No. 09/093,605, filed Jun. 9, 1998 now U.S. Pat. No. 6,507,995, which is incorporated herein by reference.

BACKGROUND OF THE INVENTION

1. Field of the Invention

The invention relates to an apparatus for manufacturing a multi-layered wiring board, and more particularly to an apparatus for manufacturing a multi-layered wiring board having interlayer connection made by conductive pillars. The invention also relates to an apparatus for manufacturing a multi-layered wiring board having conductive pillars formed on a conductive foil and an apparatus for manufacturing a multilayered wiring board having a conductive foil having conductive pillars laminated with an insulating resin layer.

2. Description of the Related Arts

Demands for high-density mounting of electronic elements are increasing as various types of electronic equipment are made compact and highly advanced in performance. In response to such demands, a type of wiring board, such as printed wiring board being used extensively is a multi-layered wiring board which has a laminated structure with insulating layers and wiring layers alternately overlaid. The multi-layered wiring board has wiring layers overlaid into a multi-layered structure in order to respond to the demands for high density and high performance. Interlayer connection of a plurality of wiring layers has been established by PTH(plated through hole(s)).

The multi-layered wiring board with via holes such as PTHs for interlayer connection of wiring layers has a disadvantage that it is not easy to comply with the demands for high-density mounting.

For example, wiring or mounting of electronic elements cannot be made in an area where a through hole is formed. Therefore, improvement of wiring density and high-density mounting is limited. In these years, wiring of the printed wiring board is also made to have high density as electronic elements are mounted in high density. When through holes are made to have a small diameter to comply with fine patterning of wiring, there is a problem that reliable interlayer connection is hardly assured.

In addition, for the interlayer connection with through holes, a through hole forming step and a plating step are involved, making the manufacturing process lengthy, and it is also disadvantageous in view of productivity.

For example, a step for forming through holes requires to make holes one by one by drilling and takes a long time. Especially, when through holes are drilled so to have a smaller diameter in this step, productivity is extremely lowered. Besides, after forming the through holes, a polishing step for removing burrs and a plating step are required.

Furthermore, positions where through holes are formed are required to be determined with high precision. It is also necessary to consider adhesion of plating to the inner walls of the through holes. Therefore, accuracy and conditions to form the through holes are complex to control, and productivity is decreased.

Especially, when the through hole has a diameter of about 0.2 mm or below, its formation takes a long time, and productivity is heavily decreased. Such problems can be remedied when a multi-layered wiring board is formed by making interlayer connection by means of conductive pillars to be described afterward.

In addition, a plating step, that electrical connection among a plurality of wiring layers is made with through holes, has to make a complex control to adjust a density of chemicals and a temperature. Besides, an apparatus for forming through holes and a facility for plating constitute a heavy burden in view of costs.

As described above, when the interlayer connection is made for the multi-layered wiring board using the through holes, productivity of the wiring substrate such as a printed wiring board (PWB) is decreased. Therefore, such a multi-layered wiring board is hard to comply with a demand for low cost.

To simplify the electrical connection among the wiring layers of the multi-layered wiring board, there is also proposed a method to connect the wiring layers with the conductive pillars. This method forms conductive pillars, such as via lands, as interlayer connections formed on a wiring circuit, and inserts the conductive pillars into the interlayer insulating layer such as a prepreg in its thickness direction to connect with the via lands formed on the opposed wiring layer.

The interlayer connection of the wiring circuit using the conductive pillars has advantages that a structure is simple, steps are not many, productivity is high, and high-density mounting can be made. However, a printed wiring board having the interlayer connection of wiring circuits using the conductive pillars has disadvantages to be described as follows.

The conductive pillars are formed on a conductive foil such as a copper foil by screen printing a plurality of times using a mask. However, no apparatus was available to print those pillars automatically. In making multiple printings by the manpower, it is difficult to keep a fixed time interval between respective printing steps, and the conductive pillars formed do not have uniform quality. Additionally an aspect ratio of the conductive pillars can be adjusted by the number of printing times, but management of the number of times to print on very many conductive foils becomes a very large burden decrease a productivity.

FIG. 19A and FIG. 19B are diagrams schematically showing a step of producing a multi-layered wiring board using conventional conductive pillars, wherein an insulating resin layer is pierced by the conductive pillars which are formed on a conductive foil.

It is seen that a conductive foil 52 such as a copper foil having conductive pillars 51 having a substantially conical shape is laminated with an insulating resin layer 53 such as a prepreg in a semi-cured state (B-stage), then heated and pressed by a plane press to pierce the insulating resin layer 53 by the conductive pillars 51. Reference numerals 91a, 91b denote press plates of the plane press. To keep the shape of the conductive pillars 51, a releasing sheet 56 is placed on the insulating resin layer 53.

However, the plane press is hard to press uniformly the entire area of the laminate. Therefore, all the conductive pillars 51 formed on the conductive foil 52 cannot pierce the insulating resin layer 53 satisfactorily due to non-uniform pressing. The conductive pillars 51 serve to make interconnection of the wiring layers of the multi-layered wiring board, so that such defective piercing is directly related to a failure of the multi-layered wiring board.

To pierce the conductive pillars 51 by the plane press, it is necessary to laminate the conductive foil 52, the insulating resin layer 53 and the releasing sheet 56 in each pressing process. After pressing, the laminate must be decomposed. Especially, when pressing is made manually, a long time is required to complete the process. Therefore, productivity of a wiring substrate is decreased.

Because of the drawbacks in the multi-layered wiring board having the interlayer connection made by the conductive pillars, it is hard to put into practical use.

Besides, when the conductive foil 52 and the insulating resin layer 53 are laminated, there is a problem that the conductive foil is readily contaminated by powder of the resin which forms the insulating resin layer.

For example, a conventional apparatus for manufacturing a printed wiring board which has the conductive foil 51 and the insulating resin layer 53 laminated has a structure as shown in FIG. 20.

For example, the insulating resin layer 53 such as a prepreg set at a predetermined position is adsorbed by aspiration heads 93 and transported so to be piled on the conductive foil 52 such as a Cu foil set at another predetermined position.

However, such a conventional apparatus has the following disadvantages.

The conventional aspiration heads partly hold the insulating resin layer by a point-to-point contact. Therefore, there is a problem that the insulating resin layer has a wrinkle when it is held and the resin forming the insulating resin layer is partly powdered to disperse to the surroundings. Furthermore, the powdered and dispersed portion of the insulating resin such as a prepreg adheres to the surface of the conductive foil and the like. As a result, an etching failure is caused or a dent is formed due to irregularities formed by the resin adhered after pressing.

In addition, the powdered prepreg produced in a step of cutting the prepreg adheres to the surface and end faces of the prepreg, and the powder has a problem of causing the same disadvantages as described above.

SUMMARY OF THE INVENTION

The invention was completed to remedy the disadvantages described above.

Specifically, it is an object of the invention to provide an apparatus for manufacturing a printed wiring board that conductive pillars can be formed automatically on a conductive foil. It is also an object of the invention to provide an apparatus for manufacturing a printed wiring board that conductive pillars having uniform properties can be formed on a conductive foil with high productivity.

The invention also aims to provide an apparatus for manufacturing a multi-layered wiring board with high productivity without having defective piercing. In addition, the invention aims to provide an apparatus for manufacturing a multi-layered wiring board that a laminate containing conductive pillars and an insulating resin layer can be pressed uniformly.

Besides, the invention aims to provide an apparatus for manufacturing a printed wiring board that a powdered portion of the prepreg can be prevented from adhering.

In order to achieve the above-described objects, the apparatus and the method for manufacturing a wiring board according to the invention has the following structure.

A first aspect of the invention relates to an apparatus for manufacturing a wiring substrate, which comprises a transporting means for transporting a sheet, the transporting means having a circuit where the sheet is circularly transported; a printing means for printing a conductive paste onto the sheet, the printing means being formed on the circuit; a counting means for counting the number of times to print the conductive paste onto the sheet; and an ejecting means for ejecting the sheet from the circuit when the counted number reaches a preset number.

By configuring as described above, conductive pillars/bumps can be automatically formed very accurately with high productivity.

The transporting means may have a conveyer combined with a direction changer. Likewise, a transporting robot may be used to transport the sheet. Besides, the transporting means may further have a first drying means on the circuit to dry the conductive paste printed by the printing means.

A memory may also be provided to store the set number for determining the number of printing times. The memory can be a non-volatile semiconductor memory such as a NAND type flash memory or an AND type flash memory.

The printing means preferably prints the conductive paste so to form a substantially conical shape on the sheet. Thus, the conductive pillars having a substantially conical shape are formed on the sheet. The conductive pillars having a substantially conical shape can easily pierce the insulating resin layer such as a prepreg in a semi-cured state (B-stage). Accordingly, productivity of a multi-layered wiring substrate is improved.

The sheet on which the conductive pillars are printed can be a conductive sheet including a conductive foil such as a copper foil or an aluminum foil. Such a conductive sheet may have a laminated structure comprises at least one conductive layer and at least one insulating layer. The insulating layer can be a prepreg, a polyimide film, a ceramics layer and the like. It is to be understood that the sheet on which the conductive pillars are printed may be a conductive layer or a wiring layer exposed to the surface of a wiring substrate.

A second aspect of the invention relates to an apparatus for manufacturing a wiring substrate, which comprises a loading means for loading at least a sheet; a means for forming conductive pillars onto the sheet; and a second drying means for drying the conductive pillars formed on the sheet; wherein the means for forming the conductive pillars comprises a transporting means for transporting the sheet, the transporting means having a first circuit and a second circuit where the sheet is circularly transported, the first circuit and the second circuit having a common part, a first printing means for printing a conductive paste on the sheet, the first printing means being formed on the first circuit, a second printing means for printing the conductive paste on the sheet, the second printing means being formed on the second circuit, a counting means for counting the number of times to print the conductive paste on the sheet, a first drying means for drying the conductive paste printed on the sheet, the first drying means being formed on the common part of the first circuit and the second circuit, a first distributing means for distributing the sheet loaded from the loading means to the first circuit and the second circuit, the first distributing means distributing the sheet ejected from the first drying means to the first circuit and the second circuit, and a second distributing means for distributing the sheet ejected from the first printing means and the sheet ejected from the second printing means to the first drying means when the counted number is less than the preset number of times, and the second distributing means distributing the sheet ejected from the first printing means and the sheet ejected from the second printing means to the second drying means when the counted number reaches the preset number.

The first distributing means distributes the conductive sheet having the conductive paste printed by the first printing means to the first circuit, and the second distributing means distributes the conductive sheet having the conductive paste printed by the second printing means to the second circuit.

In addition, the first printing means and the second printing means may be disposed symmetrically to each other on the first circuit and the second circuit. For example, conductive foils to be a pair of conductive wiring layers to hold a single layered insulating resin layer therebetween can be formed simultaneously, and a throughput can be improved.

In addition, the first printing means and the second printing means respectively print the conductive paste by using one identical mask when the conductive paste is printed onto the conductive paste already printed through the mask. Printing of the conductive paste using one and the same mask prevents displacement and allows to form fine conductive pillars accurately and uniformly.

Furthermore, the apparatus for manufacturing a wiring substrate may also have a memory for holding the preset number of times of printing the conductive paste onto the sheet.

By configuring as described above, the apparatus for manufacturing a wiring substrate according to the invention can form automatically the conductive pillars, which facilitate interlayer connection, with high productivity and high accuracy. Especially, automation facilitates to uniformly control the interval between respective printing steps, so that the conductive pillars can be formed more uniformly. Accordingly, the conductive pillars have uniform properties, and the wiring substrate having a large number of interlayer connections has improved reliability.

An apparatus for manufacturing a printed wiring board according to the invention, that an insulating resin layer is pierced by conductive pillars formed on a conductive foil, has the following structure.

Specifically, a third aspect of the invention relates to an apparatus for manufacturing a wiring substrate, which comprises a pair of rolls having a substantially parallel rotating axis, the rolls being held so as to form a gap therebetween; a means for loading a conductive sheet having a first face where conductive pillars are formed, an insulating resin sheet and a releasing sheet to the gap between the rolls so that the insulating resin sheet is interposed between the first face of the conductive sheet and the releasing sheet; and an adjusting means for adjusting the gap between the rolls so that the conductive pillars pierce the insulating resin sheet.

This pair of rolls is driven to rotate to allow the laminate to pass through the rolls under pressure. Therefore, when one of the rolls rotates clockwise, the other roll rotates counterclockwise. The apparatus for manufacturing a wiring substrate also has a driving means for driving the rolls so that the rolls have a rotating speed synchronized with a loading speed.

The individual roll may have a hollow cylindrical structure. Thus, the gap between the pair of rolls can be prevented from becoming uneven due to the expansion of rolls due to thermal expansion, and the laminate of the conductive foil, the insulating resin layer and the releasing sheet can be pressed and heated more uniformly.

The respective rolls may have therein a heating means for heating so that they have a uniform temperature distribution. For example, the distribution of surface temperature of the rolls can be limited to a small range by adjusting a winding density of a coil of an infrared heater for example. Therefore, the rolls are prevented from decentering, and the laminate can be heated and pressed more uniformly.

In addition, the releasing sheet may be loaded into the gap between the pair of rolls so that the releasing sheet has a substantially constant tension. By loading the releasing sheet into the gap between the rolls while adjusting to have a uniform tension, the releasing sheet can be prevented from having a wrinkle during pressing. Therefore, the laminate can be pressed under uniform pressure.

Furthermore, the conductive foil may be loaded so to run along one of the rolls. By adjusting the loading angle so to increase a contact area between the conductive foil and one of the rolls, the laminate is heated preliminarily before being pressed between the rolls. Thus, the insulating resin layer is pierced by the conductive pillars more uniformly and smoothly.

A fourth aspect of the invention relates to a method for manufacturing a wiring substrate, which comprises steps of loading a conductive sheet having a first face where conductive pillars are formed, an insulating resin sheet and a releasing sheet to a gap of a pair of rolls having a substantially parallel rotating axis so that the insulating resin sheet is interposed between the first face of the conductive sheet and the releasing sheet; and adjusting the gap between the rolls so that the conductive pillars pierce the insulating resin sheet.

Specifically, the method for manufacturing a printed wiring board according to the invention laminates the sheet such as a conductive foil having the conductive pillars in a substantially conical shape formed on the first face with the insulating resin sheet in a semi-cured state, and loads the laminate into the gap between the pair of rotating rolls to pierce the insulating resin sheet by the conductive pillars. The invention relates to the apparatus for manufacturing a printed wiring board that the conductive paste is printed on the conductive foil to form the conductive pillars, the insulating resin layer is laminated on the conductive foil, the laminate is heated and pressed to pierce the conductive pillars into the synthetic resin sheet, another conductive metallic foil is overlaid thereon, heated and pressed to make electrical connection of the upper and lower conductive metallic foils, and can apply the step of piercing the conductive pillars into the synthetic resin sheet to a material having a different thickness and improve a yield by varying the two rolls, the conductive bump piercing assisting material and the main material loading angle.

The apparatus for manufacturing a printed wiring board according to the invention, that the conductive foil and the insulating resin layer are laminated, has the following structure.

A fifth aspect of the invention relates to an apparatus for manufacturing a wring substrate, which comprises a holding means having a planer surface for holding an insulating resin sheet having a first face and a second face, the holding means aspirates the first face of the insulating resin sheet on the plane surface; a housing for storing a conductive foil, the housing having an opening for introducing the holding means holding the insulating resin sheet; a transporting means for transporting the holding means into the housing through the opening, the transporting means piling the insulating resin sheet onto the conductive foil; and an adjusting means for adjusting a pressure inside the housing so that the pressure inside the housing is higher than a pressure outside the housing.

Furthermore, the apparatus for manufacturing a wring substrate may have a cleaning means, which is formed outside of the opening of the housing and cleans the surface of the prepreg adsorbed by the holding member and its opposite surface. In addition, the cleaning means having at least an aspirating slit elongated with the opening, for example.

Furthermore, the apparatus for manufacturing a wring substrate may have a cleaning means, which is formed outside of the opening of the housing and cleans the surface of the prepreg adsorbed by the holding member and its opposite surface.

By configuring as described above, the apparatus for manufacturing a wiring substrate according to the invention can hold the resin sheet such as a prepreg without causing a wrinkle. In addition, no powdered resin is dispersed to the surroundings, so that a failure due to the dispersed powder can be decreased during laminating.

According to the present invention, productivity of a wiring substrate can be improved substantially, and reliability of a wiring substrate can be improved.

BRIEF DESCRIPTION OF THE DRAWINGS

FIG. 4A and FIG. 4B are diagrams schematically showing a process to print a conductive paste on a conductive foil by a printing means;

FIG. 10A and FIG. 10B are side and top views schematically showing the apparatus for manufacturing a printed wiring board of the invention shown in FIG. 9;

FIG. 20 is a diagram schematically showing an exemplified structure of the apparatus for manufacturing a conventional printed wiring board having a conductive foil and an insulating resin layer laminated.

DESCRIPTION OF THE PREFERRED EMBODIMENTS

The invention will be described in further detail with reference to the accompanying drawings.
Embodiment 1

Figure 1:
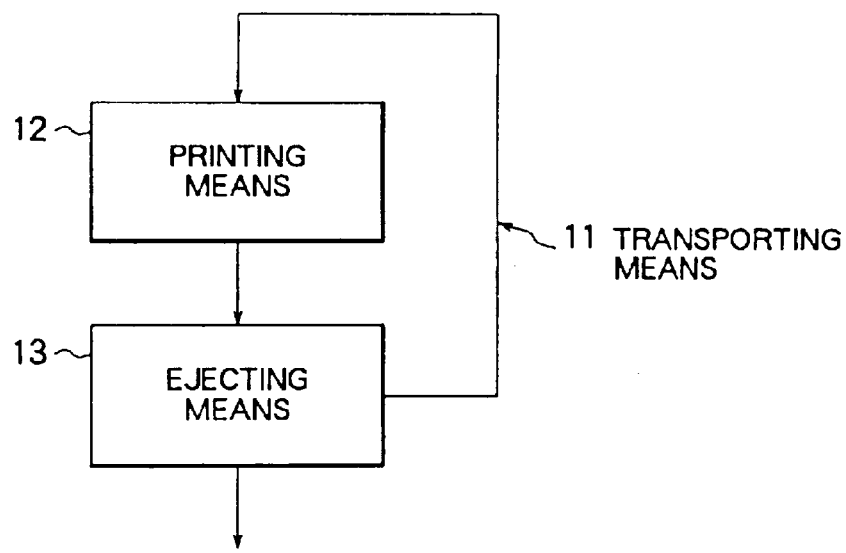
FIG. 1 is a diagram schematically showing the configuration of an apparatus for manufacturing a printed wiring board according to the invention.

FIG. 1 is a diagram schematically showing a structure of the apparatus for manufacturing a printed wiring board according to the invention. This apparatus for manufacturing a printed wiring board comprises a transporting means 11 having a circuit to circularly transport a sheet, a printing means 12 for printing a conductive paste onto the sheet, and an ejecting means 13 for ejecting the sheet from the circuit when the counted number of times to print the conductive paste onto the sheet has reached a preset number. As the ejecting means, a distributor can be employed. The distributor distributes the printed sheet out of the circuit when the counted number of times to print the conductive paste onto the sheet has reached a preset number. The distributor also distributes the printed sheet to the circuit circularly when the counted number of times is less than a preset number.

The circularly loading of the sheet and the discharge may be distinguished by, for example, a distributing means having a counter 21 to be described afterward.

The printing means 12 includes, for example, a screen printing machine and the like. Specifically, a conductive paste may be printed through a mask having pits formed at predetermined positions on a loaded conductive foil or a conductive foil on which a conductive paste has been printed by the printing means 12.

The transporting means 11 may consist of a combination of a conveyer for transporting a conductive foil ejected from the printing means, a direction changer for changing a transporting direction, an automatic charging machine for loading a conductive foil into the printing means and the like as required. As a part of the transporting means 11, an automatic loader and an automatic ejector can be disposed for loading to and ejecting from the printing machine, so that the conductive paste can be printed automatically onto the conductive foil circulating along the route of the transporting means 11.

The conductive foil on which the conductive paste is printed is circularly supplied to the same printing means by the transporting means 11.

On the other hand, when the number of times to print the conductive paste onto the previously printed conductive paste reaches a preset number, the conductive foil is ejected from the transporting means 11 by the ejecting means 13.

The ejecting means 13 may comprise a combination of, for example, a memory 23 having the number of printing times preset and a counter 21 for counting the number of printing times. For example, the counted number by the counter is compared with the preset number in the memory to judge whether the conductive paste-printed conductive foil shall be circulated along the circuit to print additionally the conductive paste or ejected from the transporting means. The preset number of printing times may be a value fixed on the apparatus or may be input through an input means by an operator.

Figure 2:
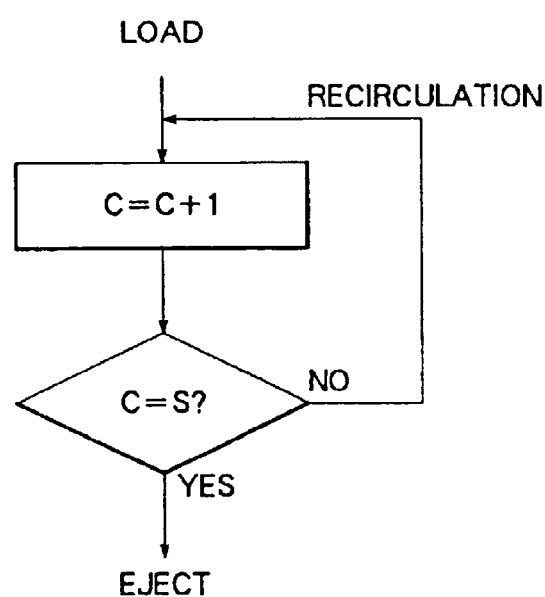
FIG. 2 is a diagram schematically showing an exemplified processing flow of the apparatus for manufacturing the printed wiring board of the invention shown in FIG. 1.
Figure 3:
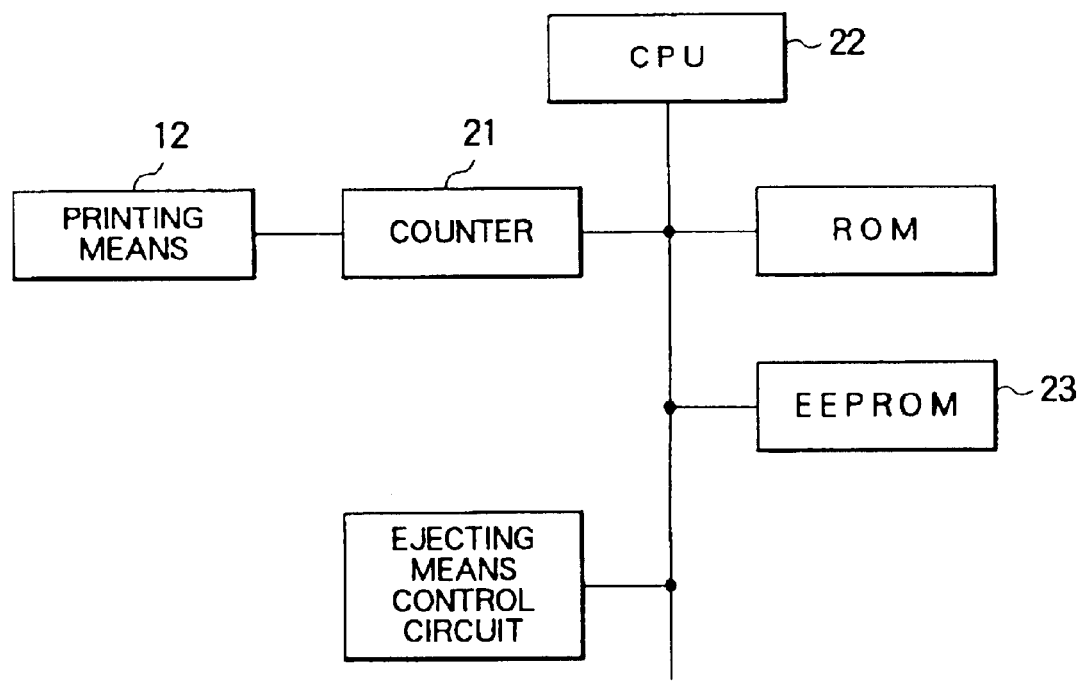
FIG. 3 is a diagram schematically showing an exemplified configuration of a control system of the apparatus for manufacturing the printed wiring board of the invention shown in FIG. 1.

FIG. 2 is a diagram schematically showing an exemplified process by a control system of the apparatus for manufacturing the printed wiring board according to the invention shown in FIG. 1. FIG. 3 is a diagram schematically showing an exemplified configuration of a control system of the apparatus for manufacturing the printed wiring board according to the invention shown in FIG. 1.

The number of printing times C is counted by the counter every time the conductive paste is printed by the printing means, such as a screen printer and compared with a predetermined value S in a nonvolatile memory such as a NAND flush type EEPROM 23 by a CPU 22. When the counted number C is less than the predetermined value S, the conductive foil is circulated to be introduced repeatedly into the printing means. When the counted number C becomes equal to the predetermined value S, the conductive foil is ejected from the transporting means and not printed with the conductive paste any more. On the circuit of the transporting means 11 is disposed a first drying means different from a drying oven (second drying means) in a subsequent step.

FIG. 4A and FIG. 4B are diagrams schematically showing a process to print a conductive paste on a conductive foil by a printing means.

Conductive pillars 14 can be formed by screen printing a conductive paste 18 onto a conductive foil 17 through a metal screen 16 which has pits 15 formed corresponding to positions where the conductive pillars 14 are formed.

The conductive paste 18 is spread with a squeegee 19 so to fill the pits 15, and the metal mask 16 is lifted up to form the conductive pillars 14 having a substantially conical shape on the conductive foil 17 (see FIG. 4A, FIG. 4B). To increase an aspect ratio of the conductive bump 14, namely to increase a ratio(=(diameter of the bottom of the conductive bump/height of the conductive bump)), the conductive paste 18 may be printed a plurality of times so to print the conductive paste over the previously printed conductive paste 18.

Figure 5A:
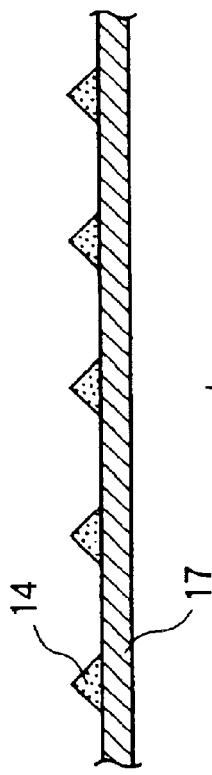
FIG. 5A, FIG. 5B and FIG. 5C are diagrams schematically showing a state that conductive pillars are formed on a conductive foil by printing a conductive paste thereon a plurality of times.
Figure 5B:
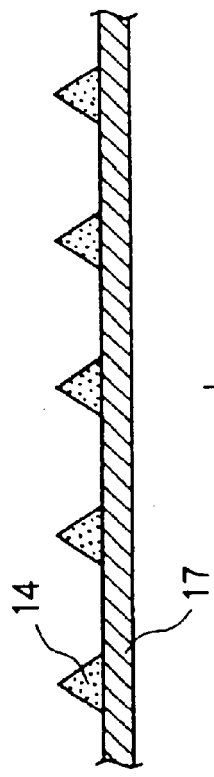
Figure 5C:
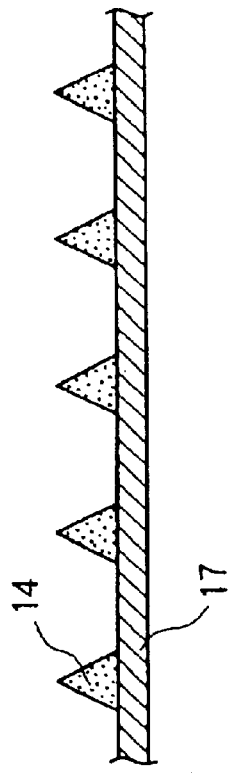

FIG. 5A, FIG. 5B and FIG. 5C are diagrams schematically showing a state that the conductive pillars are formed on the conductive foil 17 by printing the conductive paste 18 thereon a plurality of times. FIG. 5A, FIG. 5B and FIG. 5C show the conductive pillars which were formed by printing the conductive paste one time, two times and three times, respectively.

To print the conductive paste a plurality of times, one and the same mask is preferably used to uniformly form all conductive pillars and to prevent displacement. The printed conductive paste may be dried temporarily before printing the conductive paste additionally.

In the apparatus for manufacturing a printed wiring board according to the invention, the conductive foil is circulated to the same printing means by means of the transporting means, so that the same mask can be used to print the conductive paste. Accordingly, printing displacement can be minimized, and many conductive pillars can be formed uniformly on the conductive foil. This promotes a reliability and a productivity of the printed wiring board.

As described above, the apparatus for manufacturing a printed wiring board according to the invention prints the conductive paste on the conductive foil through one and the same mask a plurality of times to form the conductive pillars and has the transporting means to reload the conductive foil ejected from the printing means to the same printing means.

The predetermined route of the transporting means containing the printing means may also have a drying means such as a drying oven for preliminarily drying the printed conductive paste.

Figure 6:
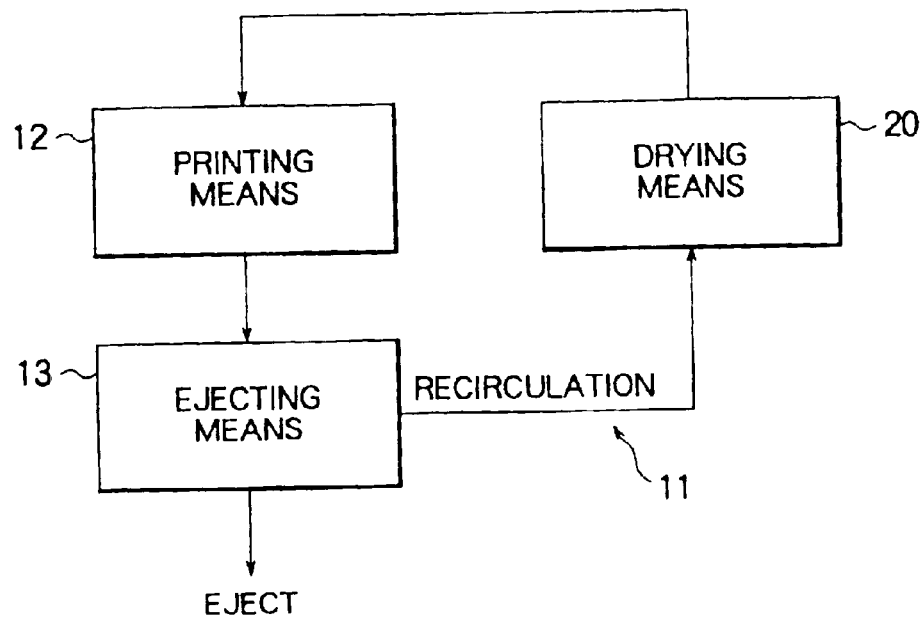
FIG. 6 is a diagram showing an exemplified configuration of the apparatus for manufacturing a printed wiring board of the invention, which has a drying means disposed on a circuit of a transporting means.

FIG. 6 is a diagram showing an exemplified configuration of the apparatus for manufacturing a printed wiring board according to the invention, which has a drying means disposed on the circuit of the conveying means.

This manufacturing device has the printing means 12, the ejecting means 13 and a drying means 20 for preliminarily drying the conductive paste on the circuit of the conveying means 11, and repeats to print and dry until the number of printing times of the conductive paste reaches a predetermined value. The configuration shown in FIG. 6 has the ejecting means 13 disposed downstream of the printing means and upstream of the drying means. Therefore, the conductive foil on which the last printing was completed does not pass through the drying means 20 but ejected from the transporting means. The ejected conductive foil is introduced into, for example, a main drying oven (second drying means) and dried more than in the preliminary drying.

Thus, the conductive paste printed on the conductive foil is dried by the preliminary drying means (first drying means). By repeating the aforementioned process for the predetermined number of times, the conductive pillars having a high aspect ratio (a diameter-to-height ratio of the bottom of the conductive bump) can be formed. The apparatus for manufacturing a printed wiring board according to the invention can control the factors, such as the number of printing times, preliminary drying duration and transporting duration, which affect on the quality of the conductive pillars. Thus, a printed wiring board having uniform properties and high reliability can be produced. In addition, by keeping a fixed interval between the printing steps, the conductive pillars can be formed to have uniform quality.

The apparatus for manufacturing a printed wiring board according to the invention does not adopt a method to print the conductive paste on the conductive foil by a plurality of printing means but circulates the conductive foil to one and the same printing means, so that machine costs can be reduced and the same mask can be used to print a plurality of times. Since the same mask is used to print the required multiple number of times to form the conductive pillars, displacement can be minimized and the conductive pillars can have high quality. Therefore, reliability of the interlayer connection of a multi-layered wiring board can be improved.

Embodiment 2

Figure 7:
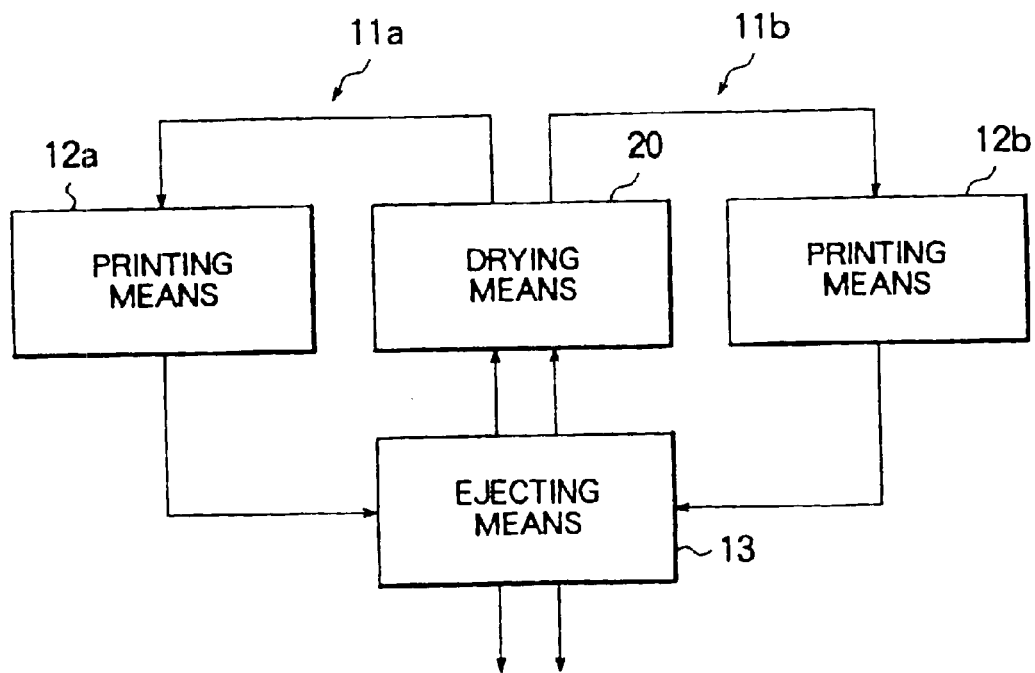
FIG. 7 is a diagram schematically showing another exemplified configuration of the apparatus for manufacturing a printed wiring board according to the invention.

FIG. 7 is a diagram schematically showing another exemplified configuration of the apparatus for manufacturing a printed wiring board according to the invention.

This apparatus for manufacturing a printed wiring board has two transporting means 11a, 11b symmetrically disposed in parallel to each other. The transporting means 11a, 11b have printing means 12a, 12b respectively.

The manufacturing device shown in FIG. 7 has a heating means 20 which is commonly used by the two transporting means 11a, 11b. The common use of the heating means 20 improves productivity because a tact time required for the preliminary heating is relatively short.

Figure 8:
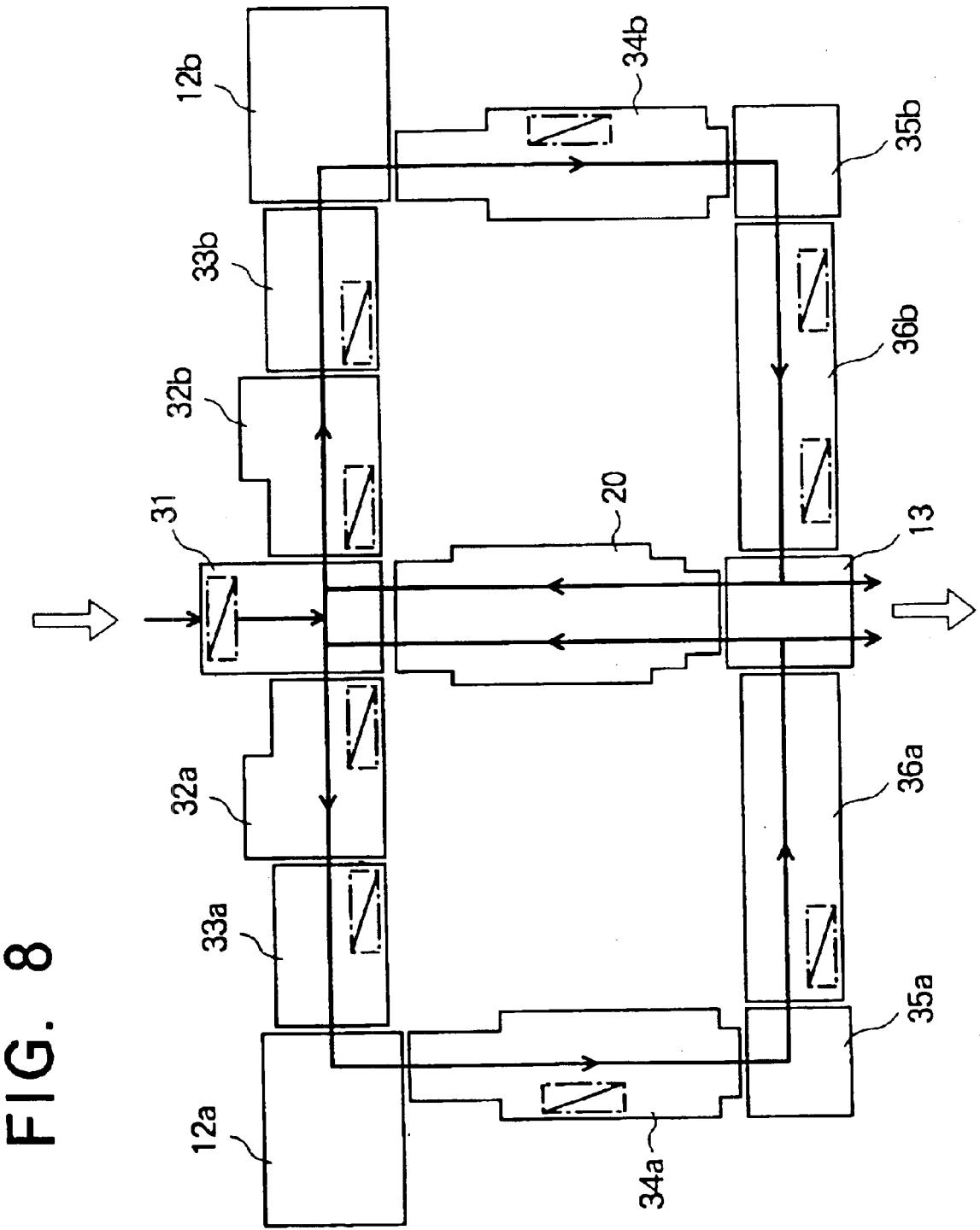
FIG. 8 is a diagram schematically showing a more specific configuration of the apparatus for manufacturing a printed wiring board according to the invention shown in FIG. 7.

FIG. 8 is a diagram schematically showing a more specific configuration of the apparatus for manufacturing a printed wiring board according to the invention shown in FIG. 7.

The conductive foil such as a copper foil is first delivered to the first circulation system (circuit) 11a and the second circulation system (circuit) 11b by a distributing type direction changer 31.

The divided conductive foils are transported by stock conveyers 32a, 32b into conductive foil loading devices 33a, 33b.

The conductive foil loading devices 33a, 33b introduce the conductive foils into printing machines 12a, 12b. The printing machines 12a, 12b print the conductive paste on predetermined positions of the introduced conductive foils through the above-described metal mask by the screen printing.

The conductive foils ejected from the printing machines 12a, 12b are transported by discharge transporting machines 34a, 34b, their transporting directions are changed by direction changers 35a, 35b, and they are introduced into the ejecting means 13 by conveyers 36a, 36b. The ejecting means may be, for example, a distributing type direction changer or the like.

As described above, the ejecting means 13 compares the number of printing times, namely the number of times that the conductive foil has circulated the first and second circulation systems 11a, 11b, with the predetermined number of printing times in order to judge whether the conductive foil shall be remained in or ejected from the circulation system.

The number of printing times is counted by a counter which is mounted on the printing machines 12a, 12b or at a midpoint of the circuit.

Furthermore, the number of times that the conductive paste is printed on a single conductive foil may be determined in advance, or a means into which the determined number of printing times can be input may be provided. The number of times to print the conductive paste to form the conductive pillars on the conductive foil may be determined based on physical properties such as a viscosity and thixotropy of the conductive paste, processing conditions such as a processing temperature and a desired shape of conductive pillars.

It is assumed that twenty conductive foils are loaded in the distributing type direction changer 31 at one time, and the number of times to print the conductive paste is set three. The distributing type direction changer 31 divides the twenty conductive foils into two each having ten conductive foils and introduces them into the first and second circulation systems 11a, 11b, respectively. Each group of ten conductive foils undergone the first printing is not ejected by the ejecting means but introduced into the drying oven 20 and dried at about 80 to about 150° C. for about 30 seconds. At the time, the heating conditions may be controlled by adjusting a temperature of the drying oven 20 and duration for passing through the drying oven 20. As described above, the apparatus for manufacturing a printed wiring board according to the invention has a relatively short tact time for the printed conductive paste. Therefore, the drying oven 20 is shared by the two circulation systems 11a, 11b. As a result, an area for installing the drying oven can be decreased and the cost for its installation can be reduced. Besides, a volume-to-surface area ratio of the drying oven can be decreased, and stable heating can be made efficiently. After the third heating, the conductive foils are ejected from the circuit by the ejecting means. In this configuration, the ejected conductive foils are introduced into the main drying oven (second drying means) and dried at a temperature higher than in the preliminary heating oven.

The apparatus for manufacturing a printed wiring board according to the invention shown in FIG. 7 and FIG. 8 has a plurality of circulation systems, thereby improving throughput. In addition, a double-side copper-clad substrate is produced by intervening a single insulating resin layer (prepreg) between two conductive foils having conductive pillars. The apparatus for manufacturing a printed wiring board according to the invention can also produce a plurality of conductive foils having a single layered insulating resin layer therebetween simultaneously.

Thus, the apparatus for manufacturing a printed wiring board according to the invention is capable of promoting stability and productivity to producing a printed wiring board having interlayer connection by means of the conductive pillars suitable for high-density mounting. The apparatus for manufacturing a printed wiring board according to the invention is capable of maintaining duration punctual and flat for performing the printing and preliminary drying steps and transportation. Therefore, a large number of conductive pillars can be formed uniformly on a single conductive foil. Thus, a reliability of the printed wiring board is promoted.

Embodiment 3

Figure 9:
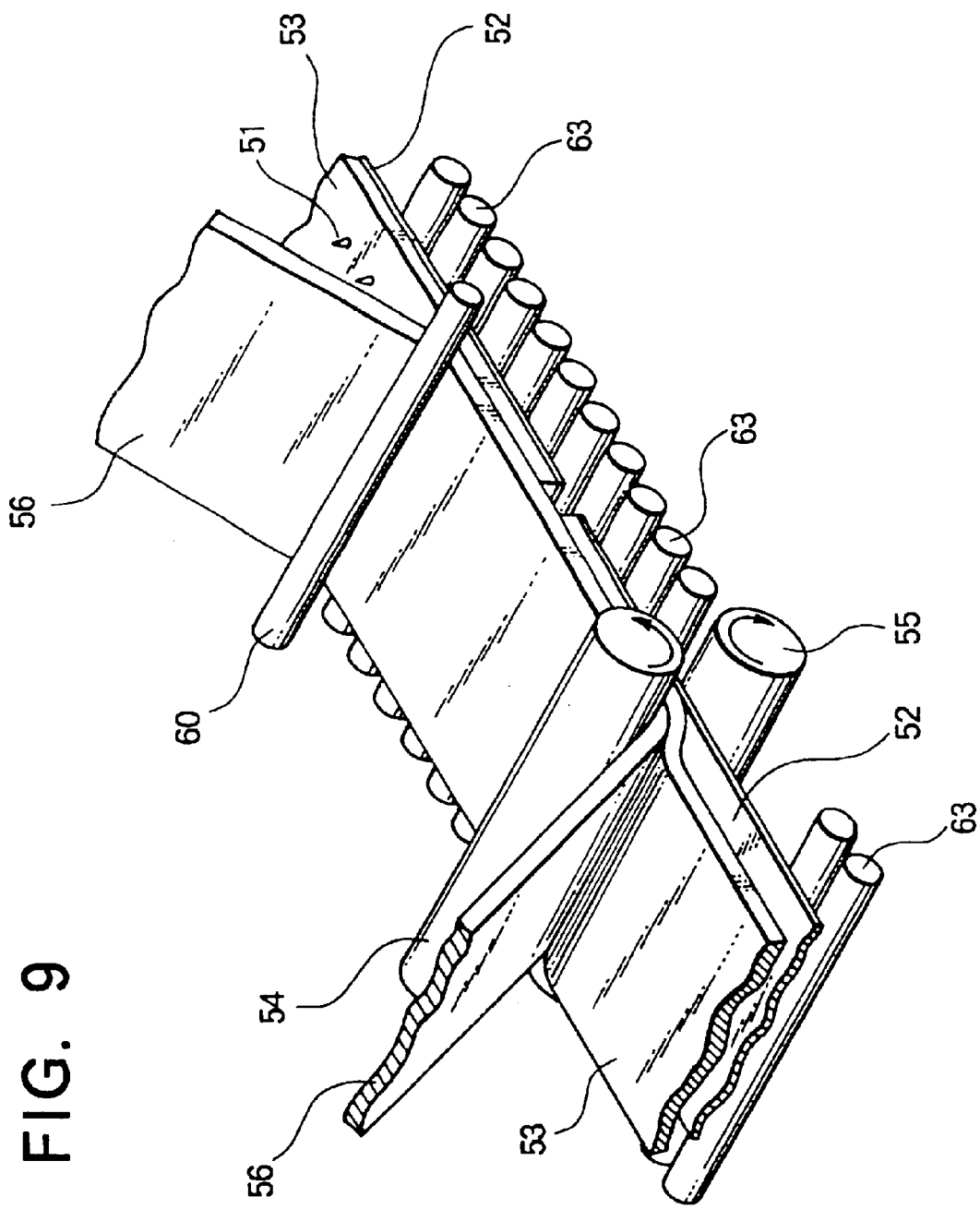
FIG. 9 is a perspective view schematically showing an exemplified configuration of the apparatus for manufacturing a printed wiring board according to the invention.

FIG. 9 is a perspective view schematically showing an exemplified configuration of the apparatus for manufacturing a printed wiring board according to the invention. FIG. 10A and FIG. 10B are side and top views schematically showing the apparatus for manufacturing a printed wiring board according to the invention shown in FIG. 9.

This apparatus for manufacturing a printed wiring board passes a laminate of a conductive foil having conductive pillars and an insulating resin layer such as a prepreg through the gap between two rolls to pierce the insulating resin layer by the conductive pillars.

Specifically, the apparatus for manufacturing a printed wiring board laminates a conductive foil 52 having conductive pillars 51 in a substantially conical shape on its first face and a semi-cured insulating resin layer 53 to pierce the insulating resin layer 53 by the conductive pillars 51. This apparatus comprises a first roll 54; a second roll 55 disposed in parallel with the first roll 54 with a predetermined gap therebetween; a means for loading the conductive foil 52, the insulating resin layer 53 and a releasing sheet 56 to pass through the gap between the first roll 54 and the second roll 55 so that the insulating resin layer 53 is interposed between the face of the conductive foil 52 having the conductive pillars 51 and the releasing sheet 56; a driving means for driving the first roll 54 and the second roll 55 so that the first roll 54 and the second roll 55 have a rotating speed synchronized with the loading speeds of the conductive foil 52, the insulating resin layer 53 and the releasing sheet 56 loaded to pass through the gap between these rolls; and an adjusting means for adjusting the gap between the first roll 54 and the second roll 55 so that the conductive pillars 51 pierce the insulating resin layer 53. The first roll 54 and the second roll 55 have a heating means such as an electric heater in them to heat the laminate so that the conductive pillars are easy to pierce the insulating resin layer. Reference numeral 63 denotes transporting rolls for transporting the conductive foil 52 and the insulating resin layer 53.

The releasing sheet 56 serves to prevent the pierced conductive pillars 51 from being crushed. The releasing sheet 56 is loaded by a releasing sheet loading roll 57, passed through the gap between the first roll 54 and the second roll 55, separated from the laminate of the conductive foil and the insulating resin layer and wound around a releasing sheet winding roll 58. The releasing sheet 56 is always loaded into the gap between the two rolls 54, 55.

The releasing sheet 56 has its loading angle adjusted by a guide roll 59 before passing through the gap between the first roll 54 and the second roll 55. The guide roll 59 may be adjustable so that a tension of the releasing sheet loaded into the gap between the first roll 54 and the second roll 55 is made constant. Furthermore, a guide roll 60 provides the releasing sheet 56 with a given tension required when it is separated from the laminate of the conductive foil 52 and the insulating resin layer 53.

The first roll 54 and the second roll 55 are held to have a parallel rotating axis and driven to rotate in synchronization with the loading speed of the laminate consisting of the conductive foil 52, the insulating resin layer 53 and the releasing sheet 56 loaded into the gap between these rolls. Driving to rotate in synchronization means that the first and second rolls 54, 55 are driven so that a speed that the laminate passes through the gap between the first roll 54 and the second roll 55 is substantially equal to a rotating speed in a tangent direction on the surface of the first roll 54 and the second roll 55.

The laminate of the conductive foil 52 having the conductive pillars 51, the insulating resin layer 53 and the releasing sheet 56, which is loaded into the gap between the first roll 54 and the second roll 55, is pressed and heated by these rolls, so that the conductive pillars 51 pierce the insulating resin layer 53. A pressing force may be adjusted by adjusting the gap between the two rolls. The apparatus for manufacturing a printed wiring board according to the invention applies a pressing force with the releasing sheet 56 also laminated. Accordingly, the conductive pillars 51 having pierced the insulating resin layer 53 can keep their shapes as they are.

Figure 19A:
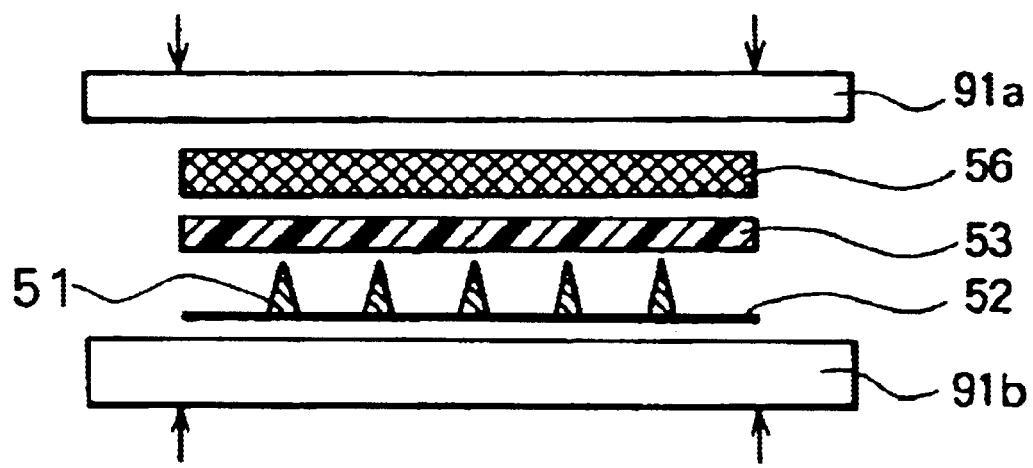
FIG. 19A and FIG. 19B are diagrams schematically showing a step of producing a multi-layered wiring board using conventional conductive pillars.
Figure 19B:
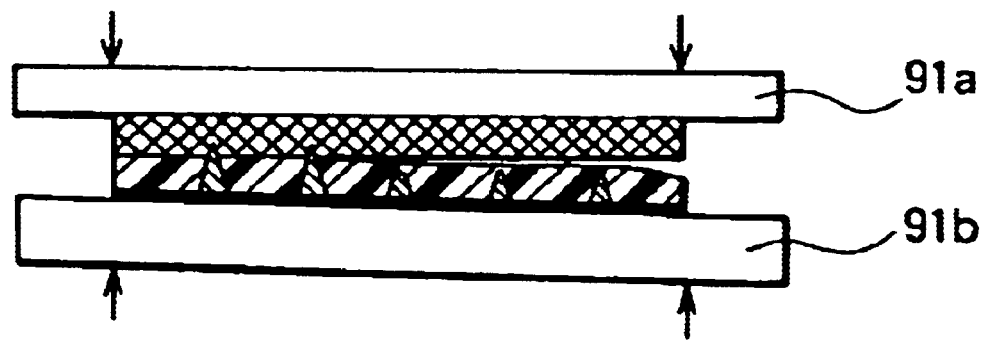

As described above, the conventional plane pressing method places and presses the conductive foil having the conductive pillars, the insulating resin layer and the releasing sheet as a pierce assisting material on the plane heat plate of the press as shown in FIG. 19A. However, it is hard to press to apply a uniform pressure onto all parts of the layers. For example, all the conductive pillars were hard to pierce the insulating resin layer due to the occurrence of nonuniform pressing as shown in FIG. 19B.

The apparatus for manufacturing a printed wiring board according to the invention presses the conductive foil 52 and the insulating resin layer 53 through the releasing sheet 56 by a linear pressing area formed in the gap between the first roll 54 and the second roll 55. Thus, more uniform pressing can be made as compared with the conventional plane press. In addition, the conductive pillars 51 can uniformly pierce the insulating resin layer.

Furthermore, the apparatus for manufacturing a printed wiring board is structured so that a plurality of laminates can be pressed continuously. Therefore, productivity of the piercing step that the insulating resin layer 53 is pierced by the conductive pillars 51 can be improved remarkably. In addition, the releasing sheet 56 which is used as the pierce assisting material can be separated automatically. Therefore, the conductive pillars can pierce without fail, a lead time can be shortened extensively, and productivity can be improved remarkably.

Embodiment 4

Figure 11A:
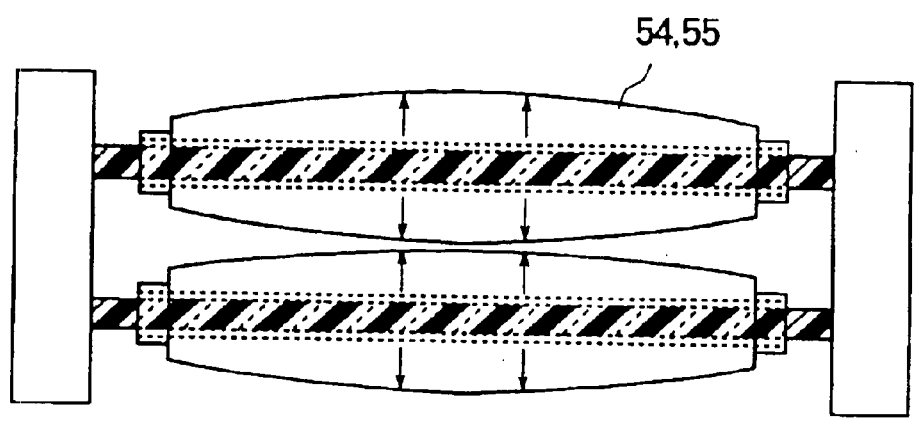
FIG. 11A and FIG. 11B are diagrams schematically showing the structure of a pair of rolls for pressing a laminate in the apparatus for manufacturing a printed wiring board according to the invention.
Figure 11B:
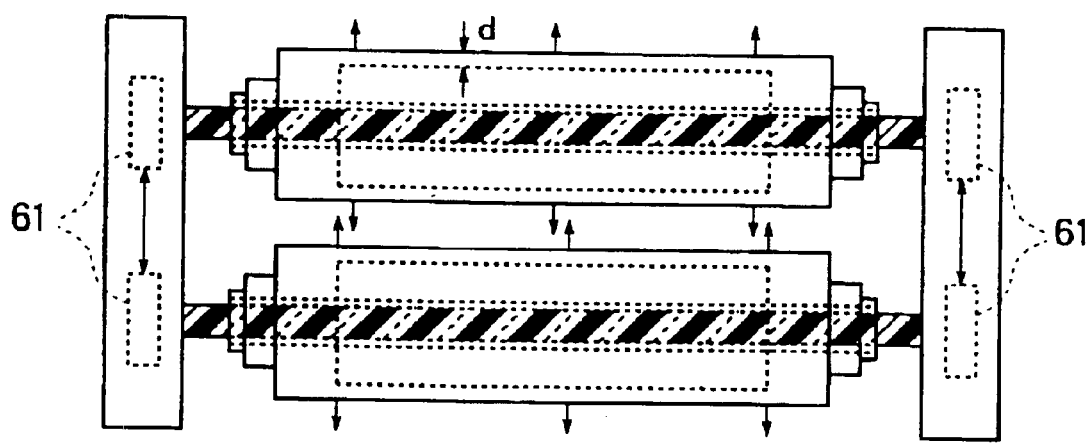

FIG. 11A and FIG. 11B are diagrams schematically showing the structure of a pair of rolls for pressing a laminate in the apparatus for manufacturing a printed wiring board according to the invention.

The first roll 54 and the second roll 55 serve to press and also heat the laminate. The laminate is heated at a temperature in a range of about 100 to about 160° C. so that the insulating resin layer is softened but not hardened. If the rolls had a solid inside (FIG. 11A), the midpoint of the rolls is largely swelled and decentered due to heat applied by the heater or the like. In addition, if decentered, the gap between the first roll 54 and the second roll 55 may have narrow and wide parts. Therefore, both ends of the laminate are not pressed sufficiently, and the pierced condition becomes often unsatisfactory.

In view of above, in order to prevent decentering from occurring due to heating, the apparatus for manufacturing a printed wiring board according to the invention preferably adopts a hollow-structured roll for the first and second rolls.

FIG. 11B is a diagram schematically showing the structure of the first roll 54 and the second roll 55.

In this case, the first roll 54 and the second roll 55 have a hollow structure so that the laminate of the conductive foil 52, the insulating resin layer 53 and the releasing sheet 56 can be pressed and heated uniformly and accurately by the first roll 54 and the second roll 55. The rolls are made of iron, stainless steel or the like, and have a width of about 400 to about 500 mm and a diameter of about 80 to about 100 mm. The rolls also have a thickness d of about 10 mm and a rotating shaft with a diameter of about 30 mm.

The gap between the first roll and the second roll can be adjusted by an adjusting means 61 which is integrally formed with the driving means for driving the rolls.

Therefore, the first roll 54 and the second roll 55 swell and shrink uniformly as the whole, so that the gap size can be held uniform along the rolls. Thus, all the conductive pillars can pierce the insulating resin layer by finely adjusting the gap size between the first roll 54 and the second roll 55.

The apparatus for manufacturing a printed wiring board according to the invention has an infrared heater within the first roll 54 and the second roll 55 as the heating means for heating them. Furthermore, a coil 62 configuring the infrared heater has a winding density small at the center and large at the ends so that a difference between a temperature Tc at the center of the roll and a temperature Te at the end is small.

Figure 12A:
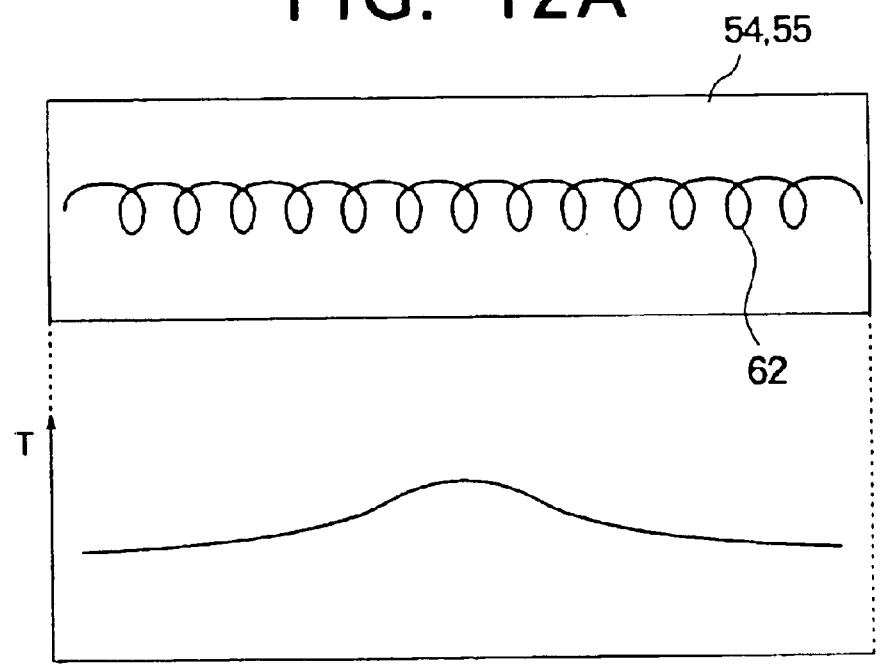
FIG. 12A is a diagram showing the distribution of a surface temperature of rotating rolls with their inside coil kept to have a fixed winding density.
Figure 12B:
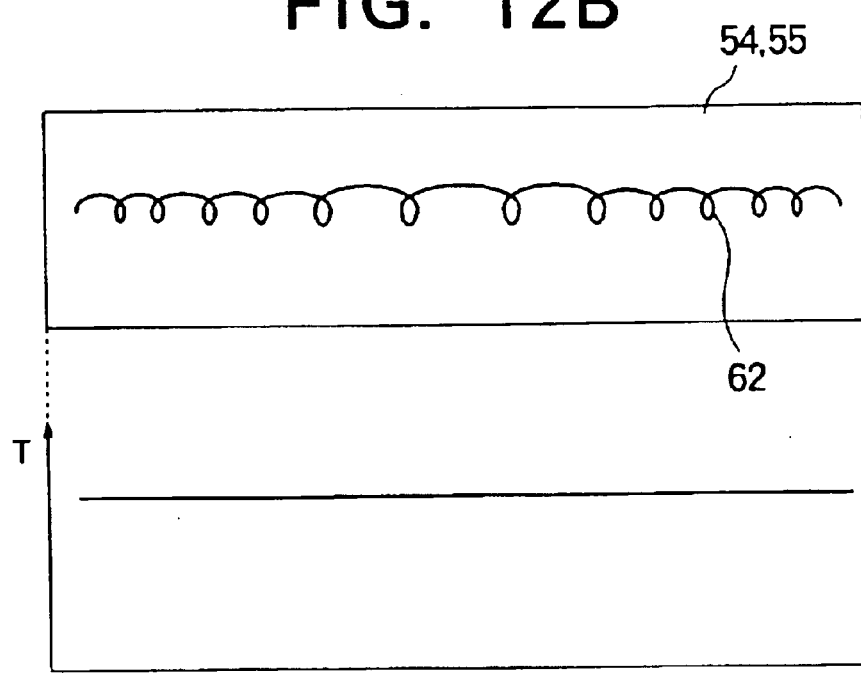
FIG. 12B is a diagram showing the distribution of a surface temperature of rotating rolls with their inside coil adjusted to have a winding density small at the middle and large at both ends.

FIG. 12A and FIG. 12B are diagrams showing the distribution of a surface temperature of the roll with the winding density of the coil 62 in the roll kept constant (FIG. 12A) and with the winding density small at the middle and large at both ends (FIG. 12B).

When the winding density of the coil is kept uniform, the roll surface has a surface temperature Tc at the center higher than a temperature Te at the ends. However, it is seen that the surface temperature of the roll is uniform and Tc and Te are substantially equal by adjusting the winding density of the coil 62.

As described above, the first roll 54 and the second roll 55 can be prevented from decentering by optimizing the arrangement of the heating means for heating them. Besides, the first roll 54 and the second roll 55 have a more uniform surface temperature, and the conductive pillars can pierce the insulating resin layer more uniformly. Therefore, a printed wiring board can be manufactured to have uniform properties and high reliability.

Embodiment 5

The inventors have found that a tension of the releasing sheet is very significant as one of conditions to pierce by all the conductive pillars finely. According to a type of printed wiring board to be manufactured, the conductive pillars may have various heights and diameters. Accordingly, the releasing sheet is required to have its thickness and material varied according to the shape of the conductive pillars. In addition, a tension of the releasing sheet is also required to be adjusted according to what releasing sheet is used. If the releasing sheet 56 had a wrinkle, the conductive foil 51 and the insulating resin layer can not be pressed uniformly.

Figure 13:
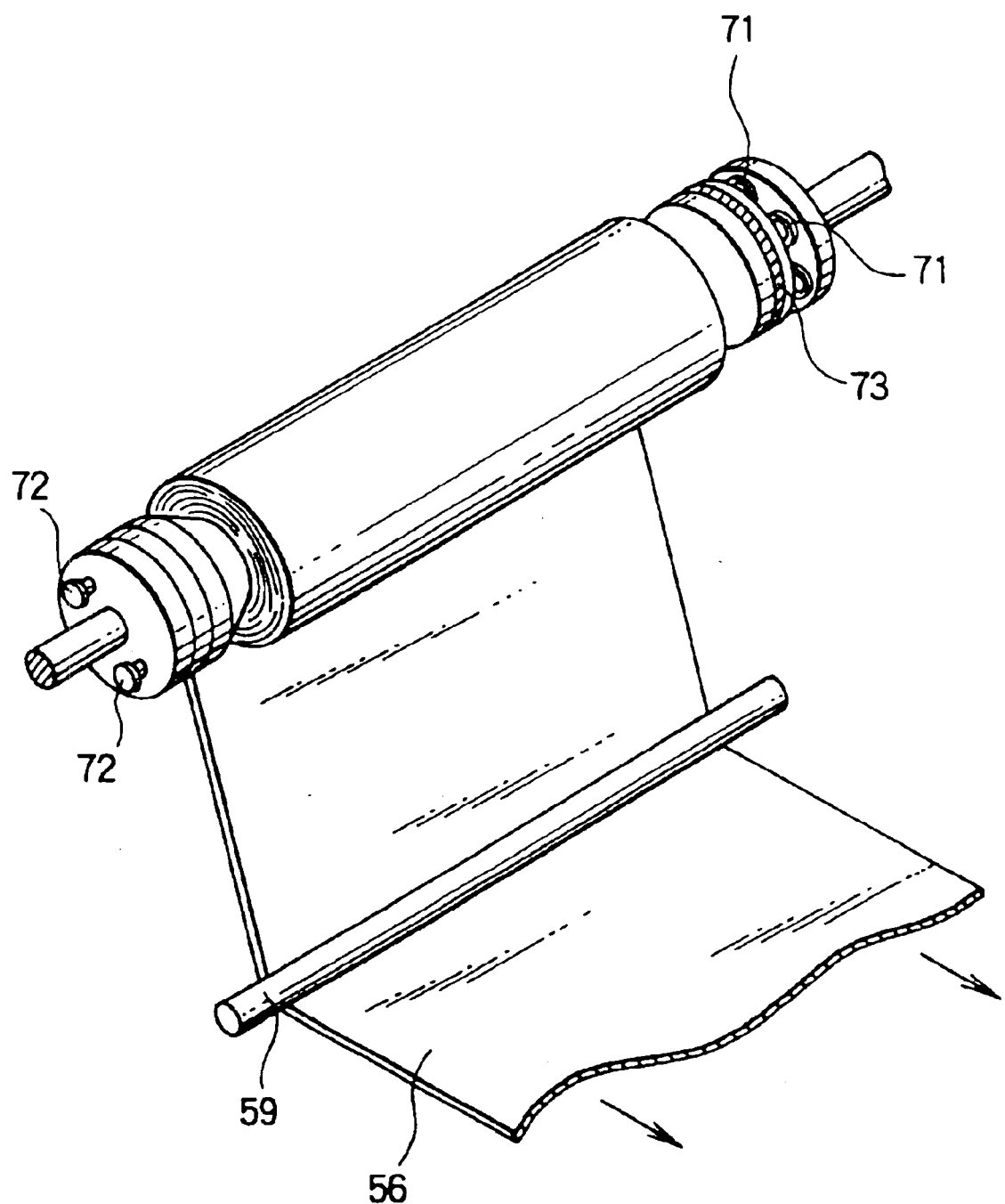
FIG. 13 is a diagram schematically showing an exemplified structure of a loading roll for a releasing sheet disposed in the apparatus for manufacturing a printed wiring board according to the invention.

FIG. 13 is a diagram schematically showing an exemplified structure of the loading roll 57 for the releasing sheet disposed in the apparatus for manufacturing a printed wiring board according to the invention.

The apparatus for manufacturing a printed wiring board according to the invention shown in FIG. 9 needs to rotate the winding roll 58 faster than the loading roll 57 for the releasing roll 56. In addition, it is necessary to cushion a change in tension as the rolls have a varying diameter.

The loading roll 57 shown in FIG. 13 can be pushed from both ends of the rotating axis by means of springs 71 and screws 72. In addition, a sliding plate 73 made of polyvinylidene fluoride or the like and having a small friction is inserted so to enable continuous and smooth loading of the releasing sheet 56. When a given force is applied from both ends of the shaft, the loading roll 57 rotates to follow the rotation of the rotating axis, so that the releasing sheet is loaded while keeping the predetermined tension of the releasing sheet. Therefore, even if a large force is applied instantaneously, a tension of the releasing sheet 56 between the first roll 54 and the second roll 55 can be kept at a certain level.

Figure 14:
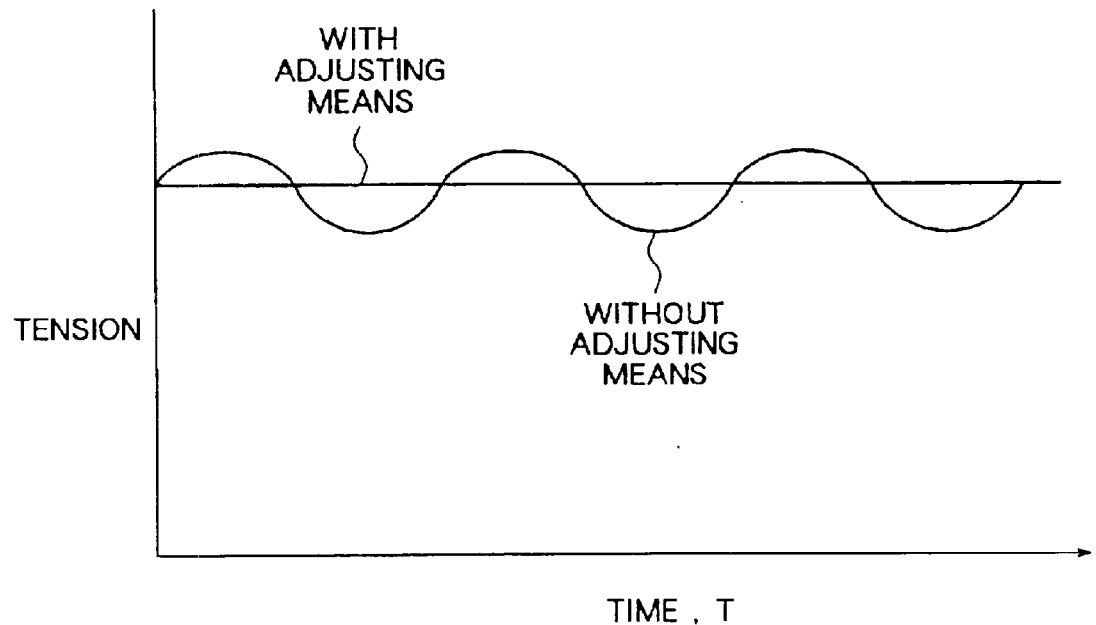
FIG. 14 is a graph schematically showing a change in tension of a releasing sheet running between first and second rolls with or without a loading roll which can adjust the tension of the releasing sheet.

FIG. 14 is a graph schematically showing a change in tension of the releasing sheet running between the first and second rolls with or without the loading roll which can adjust the tension of the releasing sheet as shown in FIG. 13. Thus, a change in tension of the releasing sheet can be made small by having the tension adjusting means as shown in FIG. 13.

Furthermore, the tension of the releasing sheet may be adjusted by making the guide roll 59 variable so to adjust its position.

By configuring as described above, the releasing sheet 56 can be loaded stably while keeping a predetermined tension according to the shape and size of the bumps. Therefore, piercing by the conductive pillars can be made stably even if the conductive pillars are small in size or the insulating resin layer has a small thickness.

Embodiment 6

Figure 15:
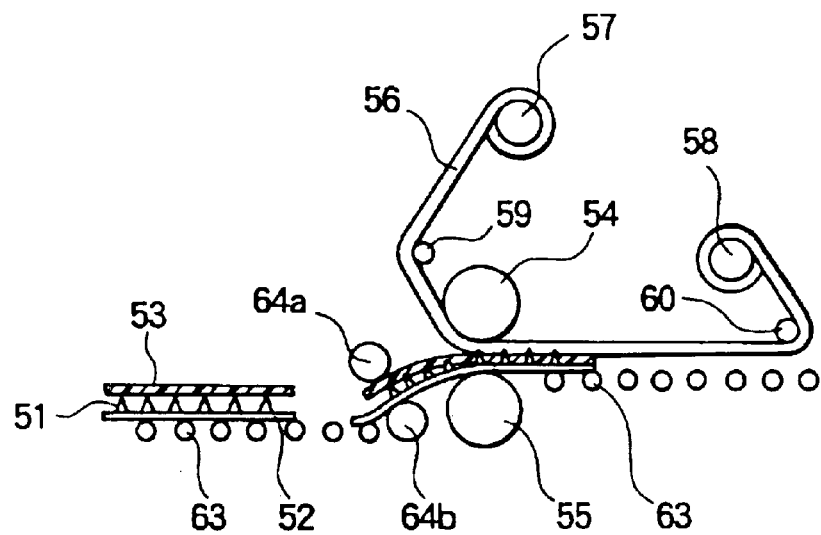
FIG. 15 is a diagram schematically showing another exemplified structure of the apparatus for manufacturing a printed wiring board according to the invention.
Figure 16:
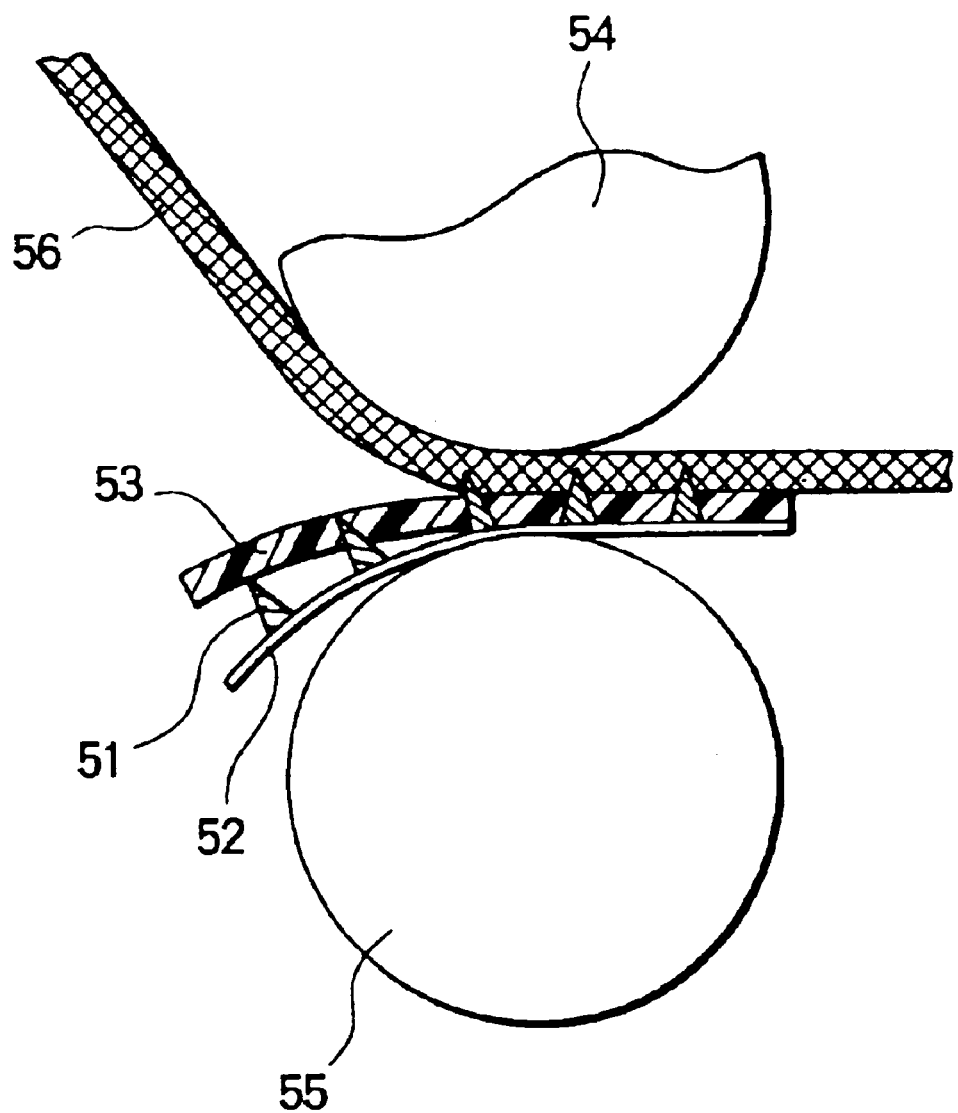
FIG. 16 is an enlarged diagram schematically showing the first and second rolls of the apparatus for manufacturing a printed wiring board according to the invention shown in FIG. 15.

FIG. 15 is a diagram schematically showing another exemplified structure of the apparatus for manufacturing a printed wiring board according to the invention. FIG. 16 is an enlarged diagram schematically showing the first and second rolls of the apparatus for manufacturing a printed wiring board according to the invention shown in FIG. 15.

This apparatus for manufacturing a printed wiring board has a loading angle of the laminate of the conductive foil 52 having the conductive pillars 51 and the insulating resin layer 53 such as a prepreg in a semi-cured state shifted so to run along the second roll 55 with respect to the gap between the first roll 54 and the second roll 55.

The loading angle of the laminate of the conductive foil 52 and the insulating resin layer 53 to the gap between the first roll 54 and the second roll 55 may be adjusted by guide rolls 64a, 64b. At this time, the laminate is preferably loaded under adjustment so that a direction of the force applied to the conductive pillars formed on the conductive foil 52 becomes as equal as possible to the axial direction of the conductive pillars, namely a normal direction of the conductive foil. Accordingly, even if the conductive pillars in a substantially conical shape have a high aspect ratio, the conductive pillars can be prevented from separating from the conductive foil or deforming.

Besides, the guide rolls 64a, 64b can be made variable to adjust the loading angle to the gap between the two rolls, so that various types of printed wiring boards having various sizes of the conductive pillars 51 can be produced, and the insulating resin layer 53 can be pierced uniformly regardless of the size and shape of the conductive pillars 51.

In addition, the loading angle of the laminate can be shifted so to run along the second roll 55 to enable the enlargement of a contact area of the laminate with the second roll 55. Therefore, before passing through the gap between the first roll and the second roll, the laminate of the conductive foil 52 and the insulating resin layer 53 can be heated preliminarily by the second roll, the conductive pillars can pierce the insulating resin layer 53 more uniformly and smoothly, a printed wiring board to be manufactured has improved quality, and productivity can be improved.

Embodiment 7

Figure 17:
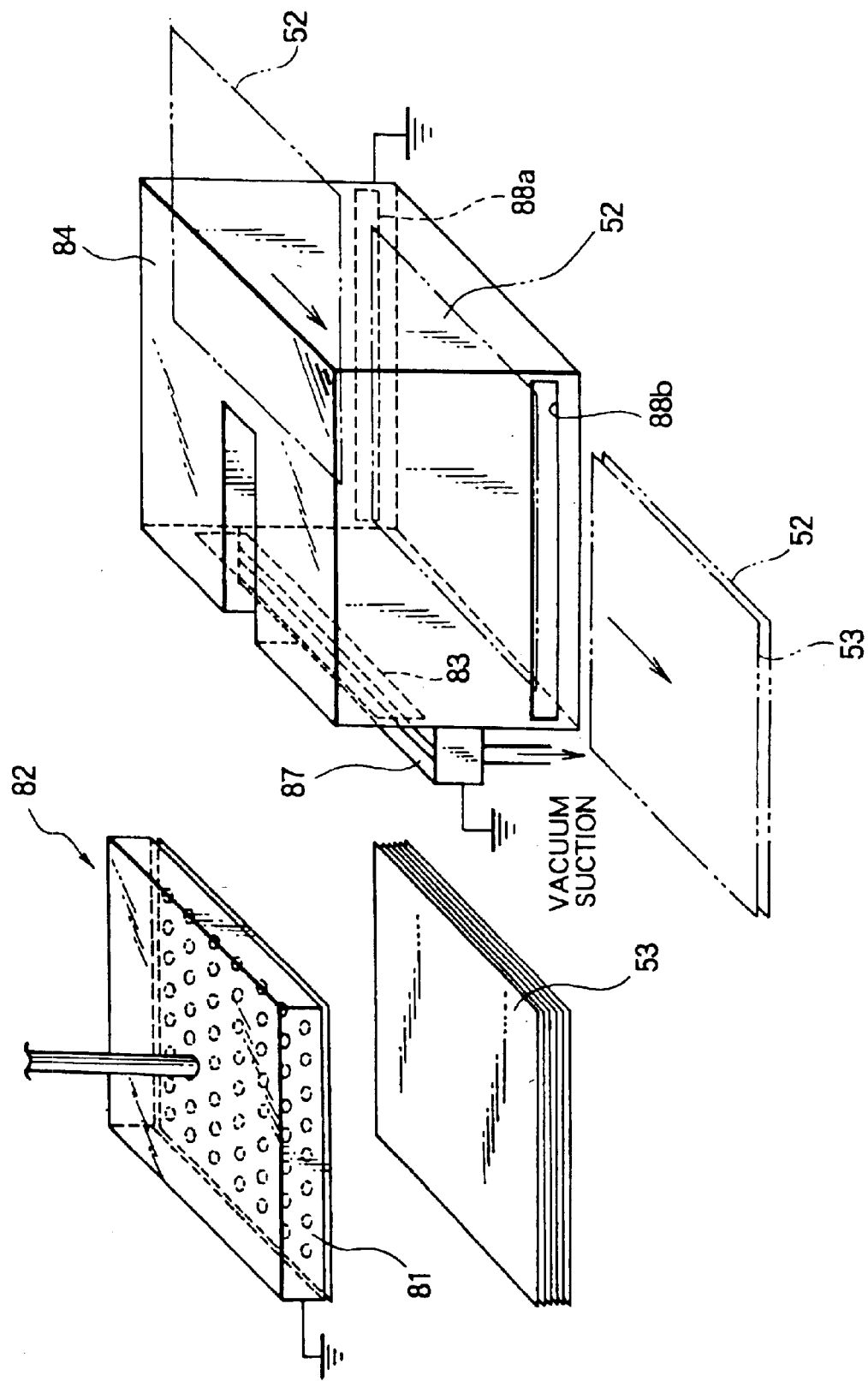
FIG. 17 is a diagram schematically showing an exemplified structure of the apparatus for manufacturing a printed wiring board according to the invention.

FIG. 17 is a diagram schematically showing an exemplified structure of the apparatus for manufacturing a printed wiring board according to the invention.

This apparatus for manufacturing a printed wiring board is an apparatus for laminating the conductive foil and the insulating resin sheet such as a prepreg and comprises a holding means 82 having a plane adsorbing surface 81 for holding an insulating resin sheet 53; a housing 84 for storing the conductive foil 52 and having side walls; a means 85 for loading the holding means 82 holding the insulating resin sheet 53 into the housing 84 through an opening 83 and overlaying the insulating resin sheet 53 onto the conductive foil 52; a pressure adjusting means 86 for adjusting a pressure inside the housing 84 so to make it higher than a pressure outside the housing; and a cleaning means 87 for cleaning the surface of the insulating resin sheet 53 adsorbed by the holding means 82 and its opposite surface.

Figure 18:
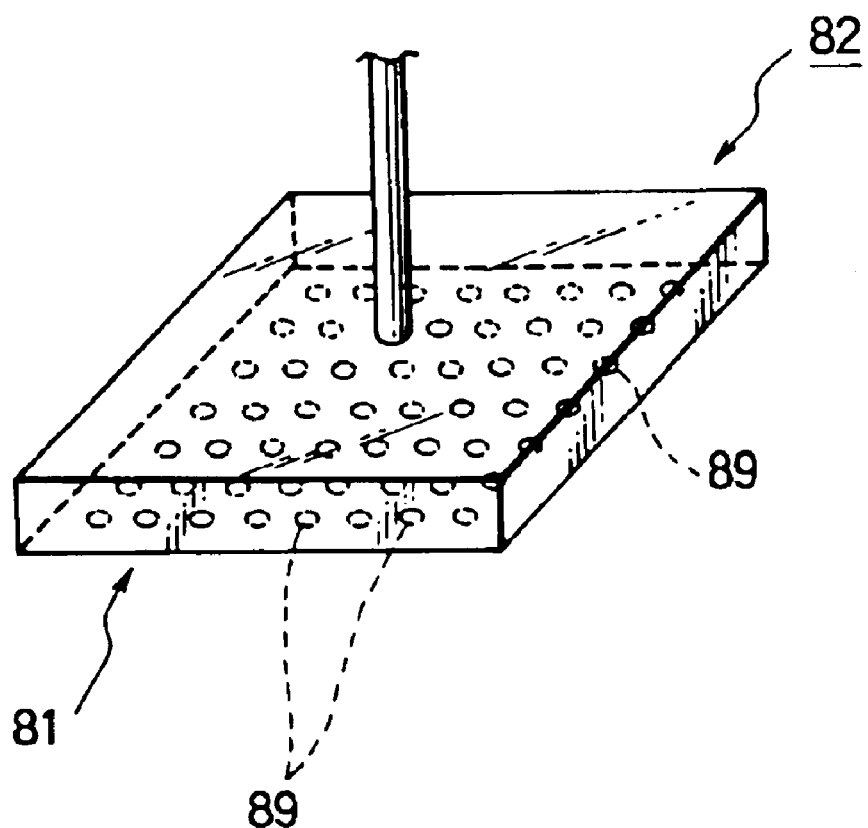
FIG. 18 is a diagram schematically showing an exemplified structure of a holding means having a plane adsorbing surface.

FIG. 18 is a diagram schematically showing an exemplified structure of the holding means 82 having a plane adsorbing surface 81. The adsorbing surface 81 has a large number of suction holes 89 and its opposite surface is under a reduced pressure. The holes formed on the adsorbing surface 81 are required to be formed so to hold the insulating resin sheet 53 such as a prepreg in a flat state. If the insulating resin sheet 53 has a wrinkle, a powdered portion of the resin is dispersed from the wrinkled part to contaminate the circumference. The adsorbing surface 81 may be, for example, a stainless steel plate with very fine holes formed in a large number or may be formed of a porous material.

The housing 84 is a space for holding the insulating resin sheet 53 loaded by the holding means 82 and the conductive foil 52 on which the insulating resin sheet 53 is laminated. The housing 84 is adjusted to have a pressure higher than outside the housing 84, so that the powdered portion of the prepreg and the like can be prevented from entering into the housing 84 from outside.

The housing 84 has the opening 83 through which the holding means 82 holding the insulating resin sheet 53 enters. The opening 83 may be formed to suit the size and shape of the holding means 82.

In addition, openings 88a, 88b are formed at a lower part of opposed side walls of the housing. The opening 88a is used to enter the conductive foil into the housing, and the opening 88b ejects the laminate of the conductive foil and the insulating resin sheet. The laminate ejected through the opening 88b may be introduced into the apparatus for manufacturing a printed wiring board according to the invention shown in, e.g. FIG. 9 or FIG. 15.

The cleaning means 87 for cleaning the surface of the insulating resin sheet 53 adsorbed by the holding member and its opposite surface is formed adjacent to the opening 83 and outside of the housing 84. The cleaning means 87 may be, for example, a vacuum suction apparatus. In this case, the cleaning means 87 must have a suction force smaller than the adsorbing force of the holding means 82.

The apparatus for manufacturing a printed wiring board according to the invention shown in FIG. 18 holds the holding means 82, the adsorbing surface 81, the housing 84, the cleaning means 87 and the like at a ground potential so to prevent from adsorbing the powdered portion of the prepreg due to electrification caused by friction or the like.

Operation of the apparatus for manufacturing a printed wiring board configured as described above will be described.

First, the holding means 82 adsorbs to hold the insulating resin sheet 53 stocked in a predetermined place.

Meanwhile, the conductive foil 52 having, for example, the conductive pillars 51 formed is loaded into the housing 84, which is kept to have a pressure higher than the circumference, through the opening 88a.

The holding means 82 holding the insulating resin sheet 53 by its flat adsorbing surface 81 is introduced by a transporting means (not shown) into the housing 84 through its opening 83. At this time, the surface opposite from the surface of the insulating resin sheet 53 held by the adsorbing surface 81 is cleaned by the cleaning means 87 such as a vacuum suction apparatus disposed outside of the opening 83 of the housing 84 to remove dust such as the powdered portion of the resin. Since the holding means 82, the adsorbing surface 81, the housing 84, the cleaning means 87 and the like are held at a ground potential, contamination such as the powdered portion of the resin can be removed effectively.

The insulating resin sheet introduced into the housing 84 is aligned and laminated with the conductive foil 52. After laminating, the aspiration by the holding means is released, and the laminate of the conductive foil 52 and the insulating resin sheet 53 is ejected through the opening 88b and introduced into the apparatus for manufacturing a printed wiring board according to the invention as shown in FIG. 9 and FIG. 15, wherein the conductive pillars 51 formed on the conductive foil pierce the insulating resin sheet 53.

Furthermore, the place where the insulating resin sheets are stored may have a space similar to the housing 84 in order to prevent the powdered portion of the resin and the like configuring the insulating resin sheet from dispersing to the surroundings.

By configuring as described above, the apparatus for manufacturing a printed wiring board according to the invention can decrease extensively the powdered portion of the insulating resin such as a prepreg from adhering to the surface of the conductive foil such as a copper foil. Therefore, defective etching due to the adhesion of the powdered resin and dents can be prevented from occurring, quality of a printed wiring board can be improved, and productivity can also be improved.

The apparatus for manufacturing a printed wiring board according to the invention can easily produce stably a printed wiring board having interlayer connection by the conductive pillars suitable for high-density mounting. The apparatus for manufacturing a printed wiring board according to the invention can perform the respective printing steps, the preliminary drying step and transportation in a fixed duration. Therefore, a large number of conductive pillars can be formed uniformly on a single conductive foil. In addition, a very reliable printed wiring board can be produced.

As compared with the conventional press using two parallel flat plates, a uniform pressure can be applied to pierce the insulating resin layer by the conductive bumpers formed on the conductive foil. Therefore, nonuniform pressurization can be prevented, and a yield can be improved. Besides, the time required in setting and disassembling the laminate can be reduced extensively thanks to the continuous processing, and productivity can be improved.

Furthermore, since the two rolls have a hollow cylindrical structure and the distribution of temperature on the rolls is prevented from becoming nonuniform by the heating means, the rolls are prevented from decentering due to thermal expansion, and the application of pressure can be made uniformly while heating.

The releasing sheet as the pierce assisting material for the conductive pillars can be supplied and wound continuously by the rolls, so that productivity can be improved remarkably. Furthermore, a tension of the releasing sheet can be adjusted to prevent the releasing sheet from having a wrinkle while pressing by the two rolls, and the laminate can be pressed more uniformly.

Furthermore, a loading angle of the laminate of the conductive foil and the insulating resin layer to the gap between the two rolls can be shifted to have a large contact area with the rolls, so that the laminate can be heated preliminarily before pressing, and the insulating resin layer can be pierced by the conductive pillars uniformly and smoothly. In addition, when the insulating resin layer is pierced by the conductive pillars having a small diameter which have a low adhesive strength against the conductive foil, the conductive pillars can be prevented from being separated due to a force laterally applied thereto.

Besides, the apparatus for manufacturing a printed wiring board according to the invention to laminate the conductive foil and the insulating resin layer can substantially reduce the adhesion of the powdered portion of the insulating resin such as a prepreg to the surface of the conductive foil such as a copper foil. Therefore, defective etching and a dent due to the adhesion of the powdered portion of the resin can be prevented, so that quality of a printed wiring board can be improved, and productivity can also be improved.

What is claimed is:

1. An apparatus for manufacturing a wiring substrate, comprising:
   a transporting means for transporting at least a sheet, and the transporting means having a circuit where the sheet is circularly transported;
   a printing means for printing a conductive paste on the sheet, and the printing means is formed on the circuit;
   a counting means for counting a number of times the conductive paste printed to the sheet;
   and an ejecting means for ejecting the sheet from the circuit when the counted number reaches a preset number.

2. An apparatus for manufacturing a wiring substrate as set forth in claim 1, further comprising a first drying means for drying the conductive paste printed on the sheet.

3. An apparatus for manufacturing a wiring substrate as set forth in claim 1, further comprising a memory for holding the preset number of times of printings of the conductive paste to the sheet.

4. An apparatus for manufacturing a wiring substrate as set forth in claim 3, wherein the memory comprises a non-volatile semiconductor memory.

5. An apparatus for manufacturing a wiring substrate as set forth in claim 1, wherein the printing means prints the conductive paste on the sheet so as to form a substantially conical shape.

6. An apparatus for manufacturing a wiring substrate as set forth in claim 1, wherein the sheet is conductive.

7. An apparatus for manufacturing a wiring substrate as set forth in claim 1, wherein the sheet comprises at least a conductive layer and at least an insulating layer laminated with the conductive layer.

8. An apparatus for manufacturing a wiring substrate as set forth in claim 1, wherein the first circuit and the second circuit are symmetrically formed.

9. An apparatus for manufacturing a wiring substrate as set forth in claim 1, wherein the first printing means and the second printing means, respectively print the conductive paste by using identical masks when printing the conductive paste onto the conductive paste already printed by the mask.

10. An apparatus for manufacturing a wiring substrate, comprising:

a loading means for loading at least a sheet;

means for forming a conductive pillar to the sheet; and a second drying means for drying the conductive pillar formed on the sheet;

wherein the means for forming a conductive pillar comprises, a transporting means for transporting the sheet, the transporting means having a first circuit and a second circuit wherein the sheet is circularly transported, and the first circuit and the second circuit having a common part, a first printing means for printing a conductive paste on the sheet, and the first printing means is formed on the first circuit, a second printing means for printing the conductive paste on the sheet, and the second printing means is formed on the second circuit, a counting means for counting a number of times the conductive paste is printed to the sheet, a first drying means for drying the conductive paste printed on the sheet, and the first drying means formed on the common part of the first circuit and the second circuit, a first distributing means for distributing the sheet loaded from the loading means to the first circuit and the second circuit, and the first distributing means distributes the sheet ejected from the first drying means to the first circuit and the second circuit, and a second distributing means for distributing the sheet ejected from the first printing means and the sheet ejected from the second printing means to the first drying means when the counted number is less than a preset number, and the second distributing means distributes the sheet ejected from the first printing means and the sheet ejected from the second printing means to the second drying means when the counted number reaches the preset number.

11. An apparatus for manufacturing a wiring substrate as set forth in claim 10, wherein the first distributing means distributes the sheet having a conductive paste printed by the first printing means to the first circuit, and the second distributing means distributes the sheet having the conductive paste printed by the second printing means to the second circuit.

12. An apparatus for manufacturing a wiring substrate as set forth in claim 10, comprising a memory for holding the preset number of times of printing of the conductive paste to the sheet.

13. An apparatus for manufacturing a wiring substrate as set forth in claim 12, wherein the memory comprises semiconductor memory.

14. An apparatus for manufacturing a wiring substrate as set forth in claim 10, wherein the first printing means and the second printing means print the conductive paste on the sheet so as to form a substantially conical shape.

15. An apparatus for manufacturing a wiring substrate as set forth in claim 10, wherein the sheet is a conductive sheet.

16. An apparatus for manufacturing a wiring substrate as set forth in claim 10, wherein the sheet is a substrate having a lamination of at least a conductive sheet and at least an insulating sheet.

* * * * *